US012230702B2

(12) United States Patent
Denninghoff et al.

(10) Patent No.: US 12,230,702 B2
(45) Date of Patent: Feb. 18, 2025

(54) SELF-PASSIVATED NITROGEN-POLAR III-NITRIDE TRANSISTOR

(71) Applicant: HRL Laboratories, LLC, Malibu, CA (US)

(72) Inventors: Daniel Denninghoff, Malibu, CA (US); Andrea Corrion, Malibu, CA (US); Fevzi Arkun, Malibu, CA (US); Micha Fireman, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 18/395,249

(22) Filed: Dec. 22, 2023

(65) Prior Publication Data

US 2024/0128367 A1 Apr. 18, 2024

Related U.S. Application Data

(62) Division of application No. 17/307,888, filed on May 4, 2021, now abandoned.

(60) Provisional application No. 63/071,912, filed on Aug. 28, 2020.

(51) Int. Cl.

| | |
|---|---|
| ***H01L 29/778*** | (2006.01) |
| ***H01L 29/423*** | (2006.01) |
| ***H01L 29/45*** | (2006.01) |

(52) U.S. Cl.

CPC ...... *H01L 29/7787* (2013.01); *H01L 29/4236* (2013.01); *H01L 29/42376* (2013.01); *H01L 29/452* (2013.01)

(58) Field of Classification Search

None

See application file for complete search history.

(56) References Cited

U.S. PATENT DOCUMENTS

2004/0155260 A1 8/2004 Kuzmik
2009/0075455 A1 3/2009 Mishra
2009/0267078 A1 * 10/2009 Mishra ............. H01L 29/66462 257/E21.403

(Continued)

FOREIGN PATENT DOCUMENTS

KR 10-2015-0090669 A 8/2015

OTHER PUBLICATIONS

From U.S. Appl. No. 17/307,888 (published as US 2022-0069114 A1), Office Action mailed on Nov. 30, 2023.

(Continued)

*Primary Examiner* — Khaja Ahmad
(74) *Attorney, Agent, or Firm* — Ladas & Parry, LLP

(57) ABSTRACT

A HEMT comprising a channel layer of a first III-Nitride semiconductor material, grown on a N-polar surface of a back barrier layer of a second III-Nitride semiconductor material; the second III-Nitride semiconductor material having a larger band gap than the first III-Nitride semiconductor material, such that a positively charged polarization interface and two-dimensional electron gas is obtained in the channel layer; a passivation, capping layer, of said first III-Nitride semiconductor material, formed on top of and in contact with a first portion of a N-polar surface of said channel layer; a gate trench traversing the passivation, capping layer, and ending at said N-polar surface of said channel layer; and a gate conductor filling said gate trench.

14 Claims, 25 Drawing Sheets

(56) References Cited

U.S. PATENT DOCUMENTS

| | | | | |
|---|---|---|---|---|
| 2010/0264461 | A1* | 10/2010 | Rajan | H01L 29/7784 257/E21.403 |
| 2012/0061680 | A1 | 3/2012 | Lee | |
| 2013/0069175 | A1 | 3/2013 | Ozaki | |
| 2015/0200286 | A1 | 7/2015 | Liu | |
| 2017/0054015 | A1* | 2/2017 | Nakata | H01L 29/7786 |
| 2020/0273974 | A1* | 8/2020 | Guidry | H01L 29/7786 |
| 2022/0069114 | A1 | 3/2022 | Deninghoff | |

OTHER PUBLICATIONS

From U.S. Appl. No. 17/307,888 (published as US 2022-0069114 A1), Office Action mailed on May 22, 2023.
From U.S. Appl. No. 17/307,888 (published as US 2022-0069114 A1), Office Action mailed on Mar. 9, 2023.
PCT International Search Report and Written Opinion from PCT/US2021/030876 dated Aug. 20, 2021.
PCT International Preliminary Report on Patentability (Chapter I) from PCT/US2021/030876 dated Feb. 28, 2023.
Guidry, Matthew, et al. "Demonstration of 30 GHz OIP3/PDC > 10 dB by mm-Wave N-polar Deep Recess MISHEMTs". University of California Santa Barbara United States, 2019.
Romanczyk, Brian, et al. "Demonstration of constant 8 W/mm power density at 10, 30, and 94 GHz in state-of-the-art millimeter-wave N-polar GaN MISHEMTs." IEEE Transactions on Electron Devices, 65. 1 (2017): 45-50.
Wienecke, Steven, et al. "N-polar GaN cap MISHEMT with record power density exceeding 6.5 W/mm at 94 GHz." IEEE Electron Device Letters 38.3 (2017): 359-362.
Extended search report from corresponding European Patent Application No. 21862260.3 dated Aug. 5, 2024.
Nidhi, et al., "N-Polar GaN/AIN MIS-HEMT for Ka-Band Power Applications," IEEE Electron Device Letters, USA, vol. 31, No. 12, Dec. 2010, pp. 1437-1439, XPO11320172, ISSN: 0741-3106.

* cited by examiner (Al,Ga)N gate barrier
GaN channel
Back Barrier
Buffer/nucleation/substrate
Mask
Regrow A
Regrow B
Regrowth A
Regrowth B
Source
Drain
Gate
Gate dielectric
32
36
40
42
44
45
46'
48
49
52
60
70
72
72"
76
92
96
103
105
106
110

Graded GaN channel
Back Barrier
Buffer/nucleation/substrate
34
54, 56, 57
118

Mask
70
40, 47

Regrow B
45
46

Mask
Regrow B
72

Regrow A
36
42

Source
Drain
Regrowth B
Regrowth A
Gate
44
Gate dielectric
60
GaN channel
48
49
115

SELF-PASSIVATED NITROGEN-POLAR III-NITRIDE TRANSISTOR

CROSS-REFERENCE TO RELATED APPLICATIONS

The present application is a divisional of U.S. patent application Ser. No. 17/307,888, filed on May 4, 2021 which claims priority to, and the benefit of, U.S. Provisional Patent Application No. 63/071,912, filed Aug. 28, 2020, and entitled "Self-Passivated Nitrogen-Polar III-Nitride Transistor.

TECHNICAL FIELD

Embodiments of the present disclosure relate to High Electron Mobility Transistors made on the N-polar surface of a III-Nitride semiconductor, as well as methods of manufacturing thereof.

BACKGROUND

III-Nitride HEMTs, in particular GaN HEMTs, are being increasingly implemented in monolithic microwave integrated circuit (MMIC) amplifiers due to an outstanding combination of properties such as speed, output power, and efficiency for transmit applications, and linearity, noise figure, and RF input survivability for receive applications. Such HEMTs can be used in high-frequency and high-power applications such as: broadband transmitters for electronic warfare jamming, phased array radars, Ka-band missile seekers, satellite communication ground terminals, high-power devices for cellular base station applications, and high-voltage devices for switching applications. The vast majority of GaN HEMTs is reported to-date have utilized a base semiconductor crystal in the [0001], or gallium-polar (Ga-polar), crystallographic orientation. However, recent reports of [000-1]-oriented GaN HEMTs—so-called "N-polar" GaN—have shown tremendous potential for high-power, high-frequency RF performance. In particular, N-polar GaN HEMTs with recessed gates and GaN cap layers have produced record output power at millimeter-wave frequencies. See for example Wienecke, Steven, et al. "*N-polar GaN cap MISHEMT with record power density exceeding* 6.5 *W/mm at* 94 *GHz*." IEEE Electron Device Letters 38.3 (2017): 359-362; and Romanczyk, Brian, et al. "*Demonstration of constant* 8 *W/mm power density at* 10, 30*, and* 94 *GHz in state-of-the-art millimeter-wave N-polar GaN MISHEMTs*." IEEE Transactions on Electron Devices 65.1 (2017): 45-50; and also Guidry, Matthew, et al. "*Demonstration of* 30 *GHz OIP*3/PDC 10 *dB by mm-Wave N-polar Deep Recess MISHEMTs*". University of California Santa Barbara United States, 2019.

High-frequency N-polar AlxGa1-xN/GaN HEMTs known from the above references have a GaN channel layer formed on the N-polar surface of an AlxGa1-xN barrier layer, and have a thick GaN cap layer above the channel layer that acts as a highly effective surface passivation layer to limit DC-to-RF dispersion and allows high output power, while a gate recess allows vertical scaling for high-frequency operation. These high frequency N-polar AlxGa1-xN/GaN HEMTs also have a secondary, thin AlGaN etch stop layer above the channel layer and under the thick GaN cap. The thin etch stop is used to form the gate foot of these HEMTs, by accurately terminating a deep dry etch of the gate recess or trench in the capping material.

However, several disadvantages to incorporating this secondary AlGaN layer include: the formation of a secondary parasitic channel at the top secondary AlGaN layer/GaN cap layer interface in the access regions (between gate and source and between gate and drain); increased oxygen incorporation, alloy scattering and additional growth interrupts inherent to an additional Al-containing layer in the device structure; and channel charge depletion due to increased band bending at the secondary AlGaN layer. Moreover, the selectivity between the etch material and etch stop is not sufficiently high in etching systems, which prevents this process from being adopted in manufacturing. Thus, the thin AlGaN etch stop layer limits the performance of the known N-Polar HEMTs and is not an effective etch stop for practical use.

SUMMARY

Embodiments of the present disclosure comprise improved high-frequency and power performance high-scaled millimeter wave (mmW) N-polar $Al_xGa_{1-x}N$/GaN HEMTs, as well as methods for fabricating same. Such HEMTs can be integrated in MMIC technology. Embodiments of the present disclosure avoid the problems of the above-described HEMTs by altogether removing the thin etch stop layer from the layer structure in the access regions of the HEMT, and instead complete the device with an additive regrowth to insulate the channel from surface effects while maintaining a high aspect ratio. In addition to suppressing the detrimental effects of the etch stop layer under the access regions, secondary benefits of embodiments of this presentation include the elimination of etch damage under the gate foot and provide a manufacturable method of achieving the desired structure.

Embodiments of this presentation comprise, as illustrated for example in FIGS. 2, 3, 4, 5, 7, 10, 11, 14, 15, 18, 19, a HEMT (for example 30; 50; 30'; 50'; 80; 85; 90; 96; 115; 120) comprising a channel layer (for example 32; 118) of a first III-Nitride semiconductor material, grown on a N-polar surface (for example 33) of a back barrier layer (for example 34) of a second III-Nitride semiconductor material; the second III-Nitride semiconductor material having a larger band gap than the first III-Nitride semiconductor material, such that a positively charged polarization interface and two-dimensional electron gas (for example 35) is obtained in the channel layer (for example 32; 118); a passivation, capping layer (for example 36; 36', 36"), of said first III-Nitride semiconductor material, formed on top of and in contact with a first portion (for example 38) of a N-polar surface (for example 40) of said channel layer (for example 32; 118); a gate trench (for example 42) traversing the passivation, capping layer (for example 36), and ending at said N-polar surface (for example 40) of said channel layer (for example 32; 118); and a gate conductor (for example 44) filling said gate trench (for example 42).

According to embodiments of this presentation, as illustrated for example in FIGS. 3, 5, 11, 15, 19 the HEMT (for example 50; 50'; 85; 96; 120) comprises a thin layer (for example 52) of a third III-Nitride semiconductor material in said gate trench (for example 42) between said gate conductor (for example 44) and said N-polar surface (for example 40) of said channel layer (for example 32, 118).

According to embodiments of this presentation, as illustrated for example in FIGS. 2, 3, 4, 5, 7, 10, 11, 14, 15, 18, 19, said passivation, capping layer (for example 36; 36', 36"), is a layer grown on said first portion (for example 38) of said N-polar surface (for example 40) of said channel layer (for example 32; 118).

According to embodiments of this presentation, as illustrated for example in FIGS. 2, 3, 4, 5, 7, 10, 11, 14, 15, 18, 19 said first III-Nitride semiconductor material is GaN and said second III-Nitride semiconductor material is AlGaN.

According to embodiments of this presentation, as illustrated for example in FIGS. 3, 5, 11, 15, 19 said third III-Nitride semiconductor material is one of AlN, InAlN, AlGaN and InAlGaN.

According to embodiments of this presentation, as illustrated for example in FIGS. 2, 3, 4, 5, 7, 10, 11, 18, 19, the HEMT (for example 30; 50; 30'; 50'; 80; 85; 115; 120) comprises a source contact layer (for example 45) and a drain contact layer (for example 46) of a fourth III-Nitride semiconductor, formed on a second portion (for example 47) of said N-polar surface (for example 40) of said channel layer (for example 32; 118) on opposite sides of said gate trench (for example 42).

According to embodiments of this presentation, as illustrated for example in FIGS. 10, 11, in the HEMT (for example 80; 85) the channel layer (for example 32) has a first doping level and the source (for example 45) and drain (for example 46) contact layers have a second doping level larger than the first doping level, wherein: a source access region of said passivation, capping layer (for example 36'), arranged between the source contact layer (for example 45) and the gate trench (for example 42), has a third doping level whose magnitude is between those of the first and second doping levels; and a drain access region of said passivation, capping layer (for example 36"), arranged between the drain contact layer (for example 46) and the gate trench (for example 42), has the first doping level.

According to embodiments of this presentation, as illustrated for example in FIGS. 2, 3, 4, 5, 7, 10, 11, 18, 19, in the HEMT (for example 30; 50; 30'; 50'; 80; 85; 115; 120) said source contact layer (for example 45) and said drain contact layer (for example 46) are layers grown on said second portion of said N-polar surface (for example 40) of said channel layer (for example 32; 118).

According to embodiments of this presentation, as illustrated for example in FIGS. 2, 3, 4, 5, 7, 10, 11, 18, 19, the HEMT (for example 30; 50; 30'; 50'; 80; 85; 115; 120) comprises a source conductor (for example 48) and a drain conductor (for example 49) in contact with respectively said source contact layer (for example 45) and said drain contact layer (for example 46).

According to embodiments of this presentation, as illustrated for example in FIGS. 2, 3, 4, 5, 7, 10, 11, 18, 19, in the HEMT (for example 30; 50; 30'; 50'; 80; 85; 115; 120), said fourth III-Nitride semiconductor material is n+ doped GaN or n+ doped InGaN.

According to embodiments of this presentation, as illustrated for example in FIGS. 14; 15, the HEMT (for example 90; 96) comprises a source contact layer (for example 45) of a fourth III-Nitride semiconductor, formed on a second portion of said N-polar surface (for example 40) of said channel layer (for example 32) on a first side of said gate trench (for example 42); and a drain contact layer (for example 46', 46") of said fourth III-Nitride semiconductor, formed on a portion (for example 92; 98) of a top surface of said passivation, capping layer (for example 36), on a second side of said gate trench (for example 42) opposite said first side of said gate trench.

According to embodiments of this presentation, as illustrated for example in FIGS. 14, 15, in the HEMT (for example 90; 96), said channel layer (for example 32) has a first doping level and said source (for example 45) and drain (for example 46'; 46") contact layers have a second doping level larger than the first doping level, wherein: a source access region of said passivation, capping layer (for example 36), arranged between the source contact layer (for example 45) and the gate trench (for example 42), has a third doping level comprised between the first and second doping levels (i.e. a third doping level whose magnitude is between those of the first and second doping levels); and a drain access region of said passivation, capping layer (for example 36), arranged between under the drain contact layer and the gate trench, has the first doping level.

According to embodiments of this presentation, as illustrated for example in FIGS. 14, 15, in the HEMT (for example 90; 96), said source contact layer (for example 45) and said drain contact layer (for example 46'; 46") are layers grown respectively on said second portion of said N-polar surface (for example 40) of said channel layer (for example 32) and on said portion (for example 92, 98) of a top surface of said capping layer.

According to embodiments of this presentation, as illustrated for example in FIGS. 14, 15, the HEMT (for example 90; 96) comprises a source conductor (for example 48) and a drain conductor (for example 49) in contact with respectively said source contact layer (for example 45) and said drain contact layer (for example 46'; 46").

According to embodiments of this presentation, as illustrated for example in FIGS. 14, 15, in the HEMT (for example 90; 96), said fourth III-Nitride semiconductor material is n+ doped GaN or n+ doped InGaN.

According to embodiments of this presentation, as illustrated for example in FIGS. 4; 5; 7, in the HEMT (for example 30'; 50'), a gate insulator layer (for example 60) lines the side and bottom of said gate conductor (for example 44) in said gate trench (for example 42).

Other embodiments of this presentation relate to the following concepts:

Concept 1. A method of manufacturing a HEMT, the method comprising:

(as for example illustrated in FIGS. 8A, 20A), forming a channel layer (for example 32; 118) of a first III-Nitride semiconductor material on a N-polar surface of a back barrier layer (for example 34) of a second III-Nitride semiconductor material, said back barrier layer having been formed on a top surface of a first epitaxial structure (for example 54, 56, 58);

(as for example illustrated in FIGS. 8B, 20B), forming a source contact layer (for example 45) and a drain contact layer (for example 46) of a third III-Nitride semiconductor on a first portion (for example 47) of a N-polar surface (for example 40) of the channel layer (for example 32), by:

forming on said N-polar surface (for example 40) of the channel layer a contacts mask (for example 70) exposing said first portion (for example 47) of said N-polar surface (for example 40) of the channel layer, but masking a second portion (for example) 38 of said N-polar surface (for example 40) of the channel layer;

(as for example illustrated in FIGS. 8C, 20C), growing said source contact layer (for example 45) and said drain contact layer (for example 46) on said first portion (for example 47) of said N-polar surface (for example) 40 of the channel layer; and removing said contacts mask (for example 70), thus exposing said second portion (for example 38) of said N-polar surface (for example 40) of the channel layer;

(as for example illustrated in FIG. 8D, 20D) forming a capping layer mask (for example 72) on top of at least a portion of said source contact layer (for example 45) and said drain contact layer (for example 46) and on top of a gate region (for example 74) of said N-polar surface (for example) 40 of the channel layer, located within said second portion (for example 38) of said N-polar surface (for example) 40 of the channel layer, thus exposing a part of said second portion (for example 38) of said N-polar surface (for example) 40 of the channel layer;

(as for example illustrated in FIG. 8E, 20E), growing a capping layer (for example 36) of said first III-Nitride semiconductor material on top of and in contact with the exposed part of the second portion (for example 38) of said N-polar surface (for example) 40 of the channel layer, said capping layer (for example 36) contacting at least side edges of said source contact layer (for example 45) and said drain contact layer (for example 46); and removing said capping layer mask (for example 72), thus forming a gate trench (for example 42) that traverses said capping layer (for example 36) and ends at said N-polar surface (for example 40) of the channel layer;

(as for example illustrated in FIG. 8F, 20F), filling said gate trench (for example 42) with a gate conductor (for example 44); and forming a source conductor (for example 48) and a drain conductor (for example 49) respectively on top of said source contact layer (for example 45) and said drain contact layer (for example 46).

Concept 2. The method of Concept 1, wherein said first epitaxial structure (54, 56, 58) comprises a buffer layer (for example 58) formed on top of a nucleation layer (for example 56) formed on top of a substrate (for example 54).

Concept 3. The method of Concept 1, wherein (as illustrated for example in FIG. 8D; 20D) said capping layer mask (for example 72) is arranged to expose a portion of said source contact layer (for example 45) and a portion of said drain contact layer (for example 46) neighboring said exposed part of said second portion (for example 38) of said N-polar surface (for example) 40 of the channel layer, whereby (as illustrated for example in FIG. 8E) said capping layer (for example 36) contacts said portion of said source contact layer (for example 45) and said portion of said drain contact layer (for example 46).

Concept 4. The method of Concept 1, wherein (as illustrated for example in FIG. 8F; 20F) said filling said gate trench (for example 42) with a gate conductor (for example 44) is done after forming a gate dielectric (for example 60) on the bottom and edges of the gate trench (for example 42).

Concept 5. The method of Concept 1, wherein (as illustrated for example in FIG. 20A) said channel layer is a graded channel layer (for example 118). In particular, the graded channel layer is a compositionally graded channel layer whose composition (e.g., Al mole fraction in AlGaN) varies along its thickness/height.

Concept 6. The method of Concept 1, wherein said first III-Nitride semiconductor material is GaN, said second III-Nitride semiconductor material is AlGaN, and said third III-Nitride semiconductor material is n+ doped GaN or n+ doped InGaN.

Concept 7. A method of manufacturing a HEMT, the method comprising:

(as for example illustrated in FIGS. 12A, 13A), forming a channel layer (for example 32) of a first III-Nitride semiconductor material on a N-polar surface of a back barrier layer (for example 34) of a second III-Nitride semiconductor material, said back barrier layer having been formed on a top surface of a first epitaxial structure (for example 54, 56, 58);

(as for example illustrated in FIGS. 12B, 13D), forming a source contact layer (for example 45) and a drain contact layer (for example 46) of a third III-Nitride semiconductor on a first portion (for example 47) of a N-polar surface (for example 40) of the channel layer (for example 32), by:

forming on said N-polar surface (for example 40) of the channel layer a contacts mask (for example 70) exposing said first portion (for example 47) of said N-polar surface (for example 40) of the channel layer, but masking a second portion (for example) 38 of said N-polar surface (for example 40) of the channel layer;

(as for example illustrated in FIGS. 12C, 13E), growing said source contact layer (for example 45) and said drain contact layer (for example 46) on said first portion (for example 47) of said N-polar surface (for example) 40 of the channel layer; and removing said contacts mask (for example 70), thus exposing said second portion (for example 38) of said N-polar surface (for example 40) of the channel layer;

(as for example illustrated in FIG. 12D, 13F) forming a first capping layer mask (for example 72') on top of at least a portion of said source contact layer (for example 45) and covering completely said drain contact layer (for example 46) and a gate region of said N-polar surface (for example) 40 of the channel layer, located within said second portion (for example 38) of said N-polar surface (for example) 40 of the channel layer, thus exposing a first part of said second portion (for example 38') of said N-polar surface (for example) 40 of the channel layer, between said gate region and said source contact layer (for example 45);

(as for example illustrated in FIG. 12E, 13G), growing a first portion of capping layer (for example 36') of said first III-Nitride semiconductor material on top of and in contact with the exposed first part of the second portion (for example 38') of said N-polar surface (for example 40) of the channel layer, said first portion of capping layer (for example 36') contacting at least side edges of said source contact layer (for example 45); and removing said first capping layer mask (for example 72');

(as for example illustrated in FIG. 12F, 13H) forming a second capping layer mask (for example 72") on top of at least a portion of said drain contact layer (for example 46) and covering completely said source contact layer (for example 45) and said gate region of said N-polar surface (for example) 40 of the channel layer, thus exposing a second part of said second portion (for example 38") of said N-polar surface (for example) 40 of the channel layer, between said gate region and said drain contact layer (for example 46);

(as for example illustrated in FIG. 12G, 13I), growing a second portion of capping layer (for example 36") of said first III-Nitride semiconductor material on top of and in contact with the exposed second part of the second portion (for example 38") of said N-polar surface (for example 40) of the channel layer, said second portion of capping layer (for example 36") contacting at least side edges of said drain contact layer (for example 46); and removing said second capping layer mask (for example 72"), thus forming a gate trench (for example 42) that traverses said capping layer (for example 36', 36") and ends at said N-polar surface (for example 40) of the channel layer;

(as for example illustrated in FIG. 12H, 13J), filling said gate trench (for example 42) with a gate conductor (for example 44); and forming a source conductor (for example 48) and a drain conductor (for example 49) respectively on top of said source contact layer (for example 45) and said drain contact layer (for example 46).

Concept 8. The method of Concept 7, wherein said first epitaxial structure (54, 56, 58) comprises a buffer layer (for example 58) formed on top of a nucleation layer (for example 56) formed on top of a substrate (for example 54).

Concept 9. The method of Concept 7, wherein (as illustrated for example in FIGS. 12D and 12F) said first and second capping layer masks (for example 72', 72") are arranged to expose a portion of said source contact layer (for example 45) and a portion of said drain contact layer (for example 46) neighboring said exposed parts of said second portion (for example 38', 38") of said N-polar surface (for example) 40 of the channel layer, whereby (as illustrated for example in FIG. 12G) said capping layer (for example 36', 36") contacts said portion of said source contact layer (for example 45) and said portion of said drain contact layer (for example 46).

Concept 10. The method of Concept 7, wherein (as illustrated for example in FIG. 12H) said filling said gate trench (for example 42) with a gate conductor (for example 44) is done after forming a gate dielectric (for example 60) on the bottom and edges of the gate trench (for example 42).

Concept 11. The method of Concept 7, further comprising (as illustrated for example in FIGS. 13A, 13B, 13C) growing a gate barrier layer (for example 76) of a fourth III-Nitride semiconductor on top of said N-polar surface (for example 40) of the channel layer (for example 32) after forming said channel layer; and, with a gate mask (for example 72), removing said gate barrier layer (for example 76) from said N-polar surface (for example) 40 of the channel layer except above said gate region, whereby said gate barrier layer covers the bottom of said gate trench (for example 42).

Concept 12. The method of Concept 7, wherein said first III-Nitride semiconductor material is GaN, said second III-Nitride semiconductor material is AlGaN, and said third III-Nitride semiconductor material is n+ doped GaN or n+ doped InGaN.

Concept 13. The method of claim Concept 11, wherein said first III-Nitride semiconductor material is GaN, said second III-Nitride semiconductor material is AlGaN, said third III-Nitride semiconductor material is n+ doped GaN or n+ doped InGaN, and said fourth III-Nitride semiconductor is AlGaN.

Concept 14. The method of claim 7, wherein the channel layer (for example 32) has a first doping level and the source (for example 45) and drain (for example 46) contact layers have a second doping level larger than the first doping level, wherein: a source access region of said passivation, capping layer (for example 36'), arranged between the source contact layer (for example 45) and the gate trench (for example 42), has a third doping level whose magnitude is between those of the first and second doping levels; and a drain access region of said passivation, capping layer (for example 36"), arranged between the drain contact layer (for example 46) and the gate trench (for example 42), has the first doping level.

Concept 15. A method of manufacturing a HEMT, the method comprising:

(as for example illustrated in FIGS. 16A), forming a channel layer (for example 32) of a first III-Nitride semiconductor material on a N-polar surface of a back barrier layer (for example 34) of a second III-Nitride semiconductor material, said back barrier layer having been formed on a top surface of a first epitaxial structure (for example 54, 56, 58);

(as for example illustrated in FIGS. 16B), forming a capping layer mask (for example 102) masking a gate region (for example 104) and a source contact region (for example 103) of a N-polar surface (for example 40) of the channel layer (for example 32), thus leaving exposed a first portion (for example 105) of said N-polar surface (for example 40) of the channel layer, between said gate region and said source contact region, and a second portion (for example 106) of said N-polar surface (for example 40) of the channel layer, on a side of said gate region opposite said source contact region;

(as for example illustrated in FIG. 16B), growing a capping layer (for example 36) of said first III-Nitride semiconductor material on top of and in contact with the exposed portions (for example 105, 106) of said N-polar surface (for example) 40 of the channel layer, and removing said capping layer mask (for example 72), thus forming a gate trench (for example 42) that traverses said capping layer (for example 36) and ends at said N-polar surface (for example 40) of the channel layer;

(as for example illustrated in FIG. 16D), forming a contacts mask (for example 70) above the gate trench and most of the capping layer (for example 36) such as to expose said source contact region (for example 103) as well as a portion of the capping layer (for (as for example illustrated in FIG. 16E), forming a source contact layer (for example 45) on said source contact region (for example 103) and forming a drain contact layer (for example 46') on top of the exposed portion of the capping layer (for example 92), and removing the contacts mask, thus exposing the gate trench (for example 42); and (as for example illustrated in FIG. 16F) forming a source conductor (for example 48) and a drain conductor (for example 49) respectively on top of said source contact layer (for example 45) and said drain contact layer (for example 46'), and filling the gate trench (for example 42) with a conductor (for example 44).

Concept 16. The method of Concept 15, wherein said first epitaxial structure (54, 56, 58) comprises a buffer layer (for example 58) formed on top of a nucleation layer (for example 56) formed on top of a substrate (for example 54).

Concept 17. The method of Concept 15, wherein (as illustrated for example in FIG. 16F) said filling said gate trench (for example 42) with a gate conductor (for example 44) is done after forming a gate dielectric (for example 60) on the bottom and edges of the gate trench (for example 42).

Concept 18. The method of Concept 15, wherein said first III-Nitride semiconductor material is GaN, said second III-Nitride semiconductor material is AlGaN, and said third III-Nitride semiconductor material is n+ doped GaN or n+ doped InGaN.

Concept 19. A method of manufacturing a HEMT, the method comprising:

(as for example illustrated in FIGS. 17A), forming a channel layer (for example 32) of a first III-Nitride semiconductor material on a N-polar surface of a back barrier layer (for example 34) of a second III-Nitride semiconductor material, said back barrier layer having been formed on a top surface of a first epitaxial structure (for example 54, 56, 58), and forming a gate barrier layer (for example 76) of a third III-Nitride semiconductor on top of said N-polar surface (for example 40) of the channel layer (for example 32)

(as for example illustrated in FIG. 17B), forming a gate mask (for example 72) exposing said gate barrier layer (for example 76) except above a gate region of said N-polar surface (for example 40) of the channel layer;

(as for example illustrated in FIG. 17C), removing said gate barrier layer (for example 76) from said N-polar surface (for example) 40 of the channel layer except above said gate region;

(as for example illustrated in FIGS. 17D), forming a capping layer mask (for example 110) masking a source contact region (for example 103) of said N-polar surface (for example 40) of the channel layer, thus leaving exposed a first portion (for example 105) of said N-polar surface (for example 40) of the channel layer, between said gate region and said source contact region, and a second portion (for example 106) of said N-polar surface (for example 40) of the channel layer, on a side of said gate region opposite said source contact region;

(as for example illustrated in FIG. 17E), growing a capping layer (for example 36) of said first III-Nitride semiconductor material on top of and in contact with the exposed portions (for example 105, 106) of said N-polar surface (for example) 40 of the channel layer, and removing said gate mask (for example 72) and said capping layer mask (for example 110), thus forming a gate trench (for example 42) that traverses said capping layer (for example 36) and ends at said N-polar surface (for example 40) of the channel layer, wherein a portion (for example 52) of said gate barrier layer lies at the bottom of said gate trench (for example 42);

(as for example illustrated in FIG. 17F), forming a contacts mask (for example 70) above the gate trench and most of the capping layer (for example 36) such as to expose said source contact region (for example 103) as well as a portion of the capping layer (for (as for example illustrated in FIG. 17G), forming a source contact layer (for example 45) on said source contact region (for example 103) and forming a drain contact layer (for example 46') on top of the exposed portion of the capping layer (for example 92), and removing the contacts mask, thus exposing the gate trench (for example 42); and (as for example illustrated in FIG. 17H) forming a source conductor (for example 48) and a drain conductor (for example 49) respectively on top of said source contact layer (for example 45) and said drain contact layer (for example 46'), and filling the gate trench (for example 42) with a conductor (for example 44).

Concept 20. The method of Concept 19, wherein said first epitaxial structure (54, 56, 58) comprises a buffer layer (for example 58) formed on top of a nucleation layer (for example 56) formed on top of a substrate (for example 54).

Concept 21. The method of Concept 19, wherein (as illustrated for example in FIG. 16F) said filling said gate trench (for example 42) with a gate conductor (for example 44) is done after forming a gate dielectric (for example 60) on the bottom and edges of the gate trench (for example 42).

Concept 22. The method of Concept 19, wherein said first III-Nitride semiconductor material is GaN, said second III-Nitride semiconductor material is AlGaN, and said third III-Nitride semiconductor material is n+ doped GaN or n+ doped InGaN.

Concept 23. A method of manufacturing a HEMT, the method comprising:

(as for example illustrated in FIG. 9A; 21A), forming a channel layer (for example 32; 118) of a first III-Nitride semiconductor material on a N-polar surface of a back barrier layer (for example 34) of a second III-Nitride semiconductor material, said back barrier layer having been formed on a top surface of a first epitaxial structure (for example 54, 56, 58);

(as for example illustrated in FIG. 9B; 21B) forming a capping layer mask (for example 72) on top of a gate region (for example 74) of said N-polar surface (for example) 40 of the channel layer, thus exposing a first portion of said N-polar surface (for example) 40 of the channel layer;

(as for example illustrated in FIG. 9D; 21D), growing a capping layer (for example 36) of said first III-Nitride semiconductor material on top of and in contact with the exposed first portion of said N-polar surface (for example) 40 of the channel layer; and removing said capping layer mask (for example 72), thus forming a gate trench (for example 42) that traverses said capping layer (for example 36) and ends at said N-polar surface (for example 40) of the channel layer;

(as for example illustrated in FIG. 9E; 21E), forming a source contact layer (for example 45) and a drain contact layer (for example 46) of a third III-Nitride semiconductor on distal parts of said first portion of said N-polar surface (for example 40) of the channel layer, by:

forming on said gate trench (for example 42) and on proximal parts of said capping layer (for example 36) a contacts mask (for example 70) exposing distal parts of said capping layer (for example 36);

(as for example illustrated in FIG. 9F; 21F), etching away said distal parts of said capping layer (for example 36), thus exposing said distal parts of said first portion of said N-polar surface (for example 40) of the channel layer;

(as for example illustrated in FIG. 9G; 21G), growing said source contact layer (for example 45) and said drain contact layer (for example 46) on said distal parts of said first portion of said N-polar surface (for example 40) of the channel layer; and removing said contacts mask (for example 70), thus exposing again said gate trench (for example 42);

(as for example illustrated in FIG. 9H; 21H), filling said gate trench (for example 42) with a gate conductor (for example 44); and forming a source conductor (for example 48) and a drain conductor (for example 49) respectively on top of said source contact layer (for example 45) and said drain contact layer (for example 46).

Concept 24. The method of Concept 23, further comprising growing a gate barrier layer (for example 76) of a fourth III-Nitride semiconductor on top of said channel layer (for example 32) before said forming a capping layer mask (for example 72), whereby said gate barrier layer covers the bottom of said gate trench (for example 42).

Concept 25. The method of Concept 23, wherein said first epitaxial structure (54, 56, 58) comprises a buffer layer (for example 58) formed on top of a nucleation layer (for example 56) formed on top of a substrate (for example 54).

Concept 26. The method of Concept 23, wherein (as illustrated for example in FIG. 9H; 21H) said filling said gate trench (for example 42) with a gate conductor (for example 44) is done after forming a gate dielectric (for example 60) on the bottom and edges of the gate trench (for example 42).

Concept 27. The method of Concept 23, further comprising (as illustrated for example in FIGS. 21A, 21B, 21C) growing a gate barrier layer (for example 76) of a fourth III-Nitride semiconductor on top of said N-polar surface (for example 40) of the channel layer (for example 118) after forming said channel layer; and, with a gate mask (for example 72), removing said gate barrier layer (for example 76) from said N-polar surface (for example) 40 of the channel layer except above said gate region, whereby said gate barrier layer covers the bottom of said gate trench (for example 42).

Concept 28. The method of Concept 23, wherein (as illustrated for example in FIG. 21A) said channel layer is a graded channel layer (for example 118). In particular, the graded channel layer is a compositionally graded channel layer whose composition (e.g., Al mole fraction in AlGaN) varies along its thickness/height.

Concept 29. The method of Concept 23, wherein said first III-Nitride semiconductor material is GaN, said second III-Nitride semiconductor material is AlGaN, and said third III-Nitride semiconductor material is n+ doped GaN or n+ doped InGaN, and said fourth III-Nitride semiconductor is AlGaN.

Concept 30. The method of Concept 27, wherein said first III-Nitride semiconductor material is GaN, said second III-Nitride semiconductor material is AlGaN, said third III-Nitride semiconductor material is n+ doped GaN or n+ doped InGaN, and said fourth III-Nitride semiconductor is AlGaN.

This Summary is provided to introduce a selection of concepts in a simplified form that are further described below in the Detailed Description.

BRIEF DESCRIPTION OF THE DRAWINGS

Various embodiments in accordance with the present disclosure will be described with reference to the drawings, in which.

The figures are drawn to clearly illustrate the relevant aspects of the embodiments and are not necessarily drawn to scale.

DETAILED DESCRIPTION OF EMBODIMENTS

In the following detailed description, reference is made to the accompanying drawings which form a part hereof, and in which are shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the invention. The following detailed description is therefore not to be taken in a limiting sense, and the scope of the invention is defined only by the appended claims and equivalents thereof. Like numbers in the figures refer to like components, which should be apparent from the context of use.

Figure 1A:
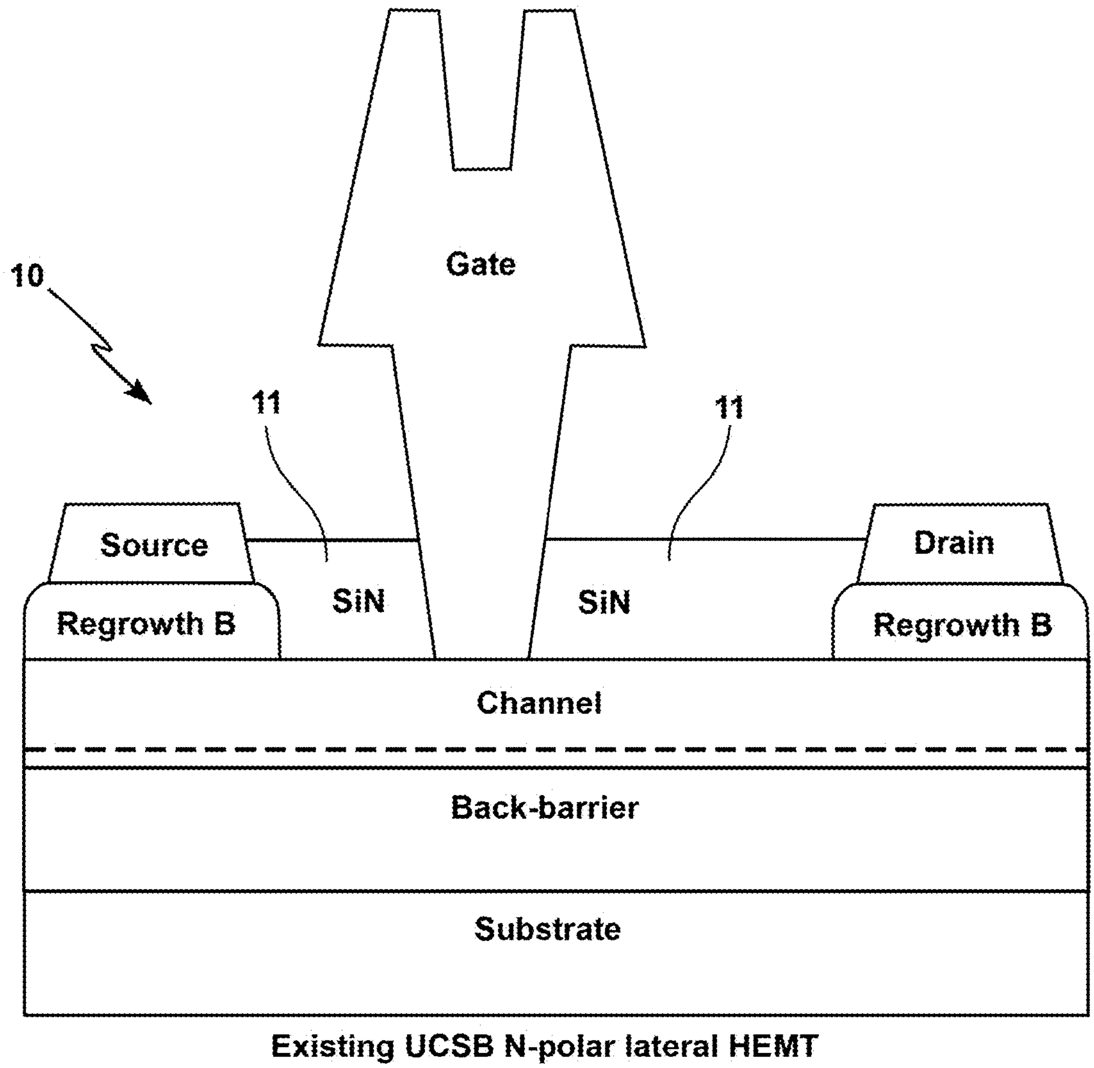
FIG. 1A illustrates a known N-polar HEMT.

FIG. 1A illustrates a known N-polar HEMT 10 using a dielectric passivation capping layer 11 (SiN illustrated). While specially developed dielectric passivation somewhat improves the performance of GaN HEMTs, it does not eliminate dc-RF dispersion (also known as current collapse) and results in reduced HEMT output power at any operating frequency. Moreover, dielectric passivation and field plates—which are used to reduce dc-RF dispersion in low-frequency GaN HEMTs—are detrimental to the performance of high-frequency GaN HEMTs. The highly scaled GaN HEMTs used in high-frequency applications are particularly sensitive to surface conditions. Dielectric passivation in GaN HEMTs only mitigates—but does not eliminate—the detrimental dc-RF dispersion in the performance of the HEMT at any frequency. An effective method of eliminating dc-RF dispersion is replacing a dielectric passivation capping layer with semiconductor passivation capping layer.

Figure 1B:
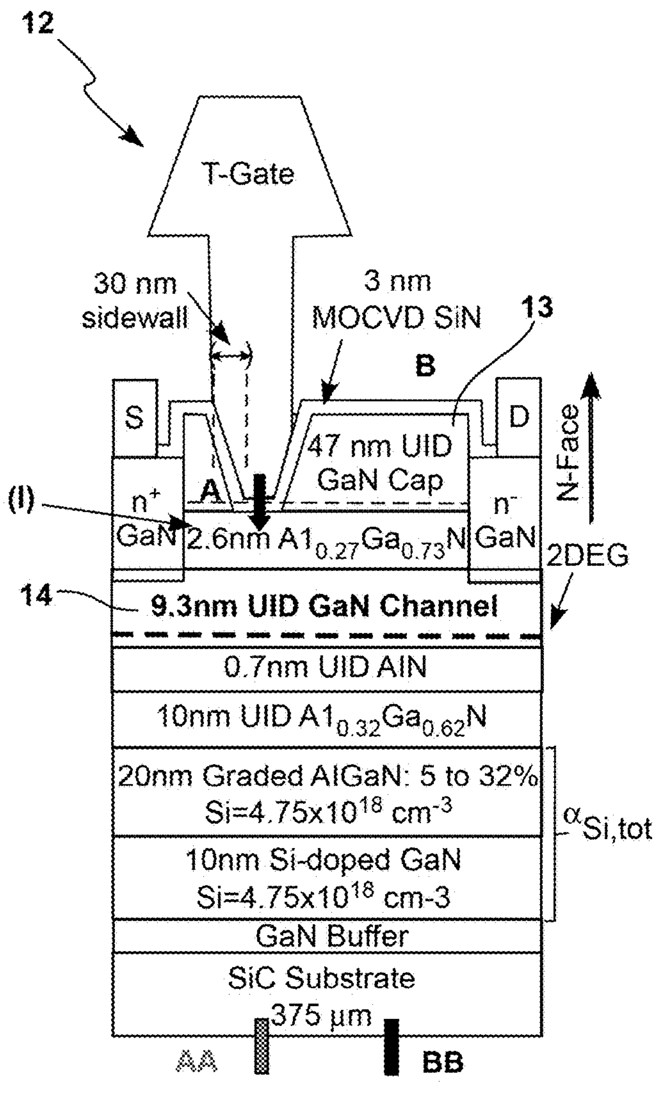
FIGS. 1B to 1D illustrate a known N-polar HEMT and some of its energy bands.
Figure 1C:
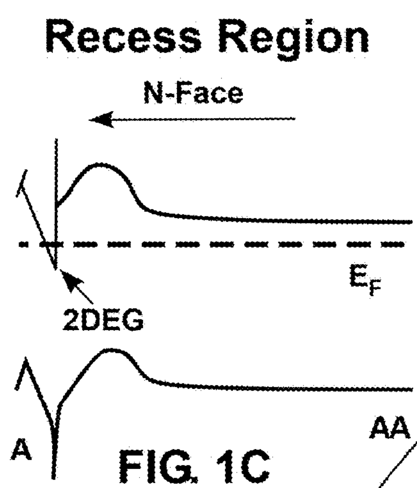
Figure 1D:
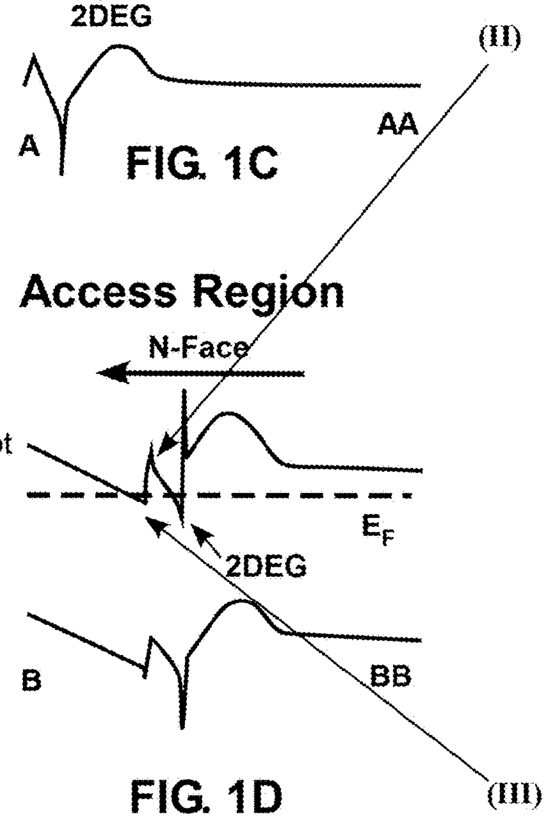

FIG. 1B illustrates a known N-polar HEMT 12 using a semiconductor passivation 13 (GaN illustrated) to address the shortcomings of the HEMT 10 illustrated in FIG. 1A. In order to stop the gate trench etching from etching the channel layer 14 (GaN illustrated), an etch stop layer (I)

made out of another semiconductor (AlGaN illustrated) is formed on top of the channel 14. FIG. 1C illustrates the energy band diagrams at equilibrium in the gate recessed region and FIG. 1D illustrates the energy band diagrams in the drain access region. i.e. between the gate and drain. As illustrated in FIGS. 1B and 1D, the (AlGaN) etch stop layer (reference I, FIG. 1B) pulls up (reference II, FIG. 1D) the conduction band, thus depleting the 2DEG/channel of the HEMT. Further, the (AlGaN) etch stop layer (reference I, FIG. 1B) creates a parasitic electron channel (reference III, FIG. 1D) that can detrimentally affect the performance of the HEMT.

Figure 2:
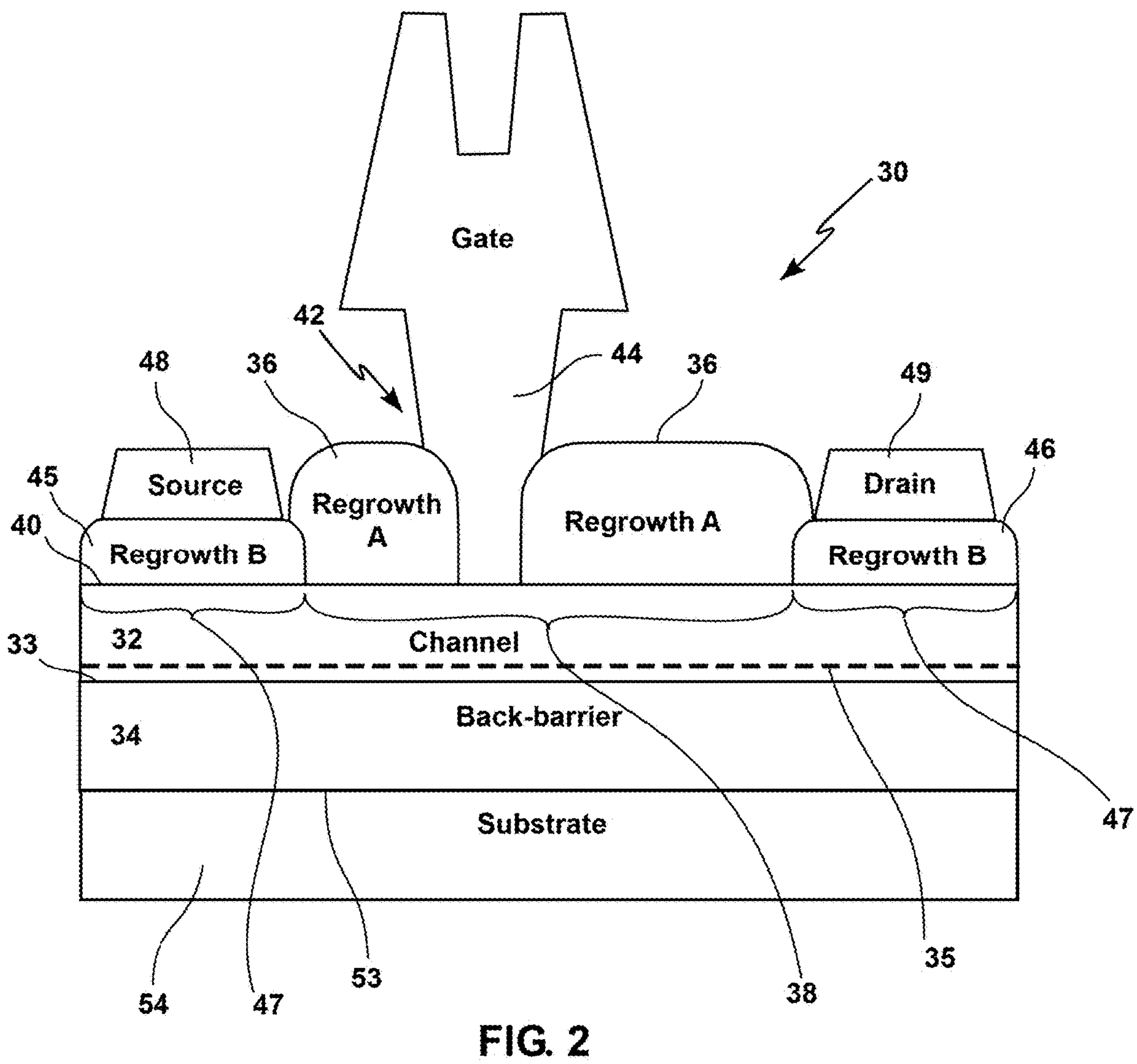
FIG. 2 illustrates an embodiment of a HEMT according to this presentation.

FIG. 2 illustrates an embodiment of a HEMT 30 according to this presentation, comprising a channel layer 32 of a first III-Nitride semiconductor material (e.g. GaN), grown on a N-polar surface 33 of a back barrier layer 34 of a second III-Nitride semiconductor material (e.g. AlGaN). According to an embodiment of this presentation, the second III-Nitride semiconductor material (e.g. AlGaN) has a larger band gap than the first III-Nitride semiconductor material (e.g. GaN), such that a positively charged polarization interface and two-dimensional electron gas 35 is obtained in the channel layer 32. According to embodiments of this presentation, the back barrier 34 can be any coherently strained layer (i.e. a layer so thin that lattice constant mismatches do not result in lattice mismatch crystal defects but are contained by lattice stretching.), or combination of coherently strained layers. According to embodiments of this presentation, in case the first III-Nitride semiconductor material comprises GaN, the back barrier 34 can be composed of any Al containing III-nitride material and of larger band gap than GaN such that a positively charged polarization interface and two dimensional electron gas 35 is obtained in the channel 32 above the interface of the back barrier 34 with the GaN channel 32. According to embodiments of this presentation, channel 32 can be formed atop the back barrier layer as a final layer of an initial epitaxial structure growth. According to embodiments of this presentation, as channel layer 32 is grown on a N-polar surface 33 of back barrier layer 34, a top surface 40 of channel layer 32 is also a N-polar surface.

According to an embodiment of this presentation, HEMT 30 further comprises a capping layer 36 ("regrowth A") of said first III-Nitride semiconductor material, formed on top of and in contact with a first portion 38 of N-polar surface 40 of channel layer 32. According to an embodiment of this presentation, HEMT 30 further comprises: a gate trench 42 traversing the capping layer 36 and ending at the N-polar surface 40 of the channel layer 32; and a gate conductor 44 filling gate trench 42. According to embodiments of this presentation, the material described as AlGaN is effectively an Al(x)Ga(1-*x*)N material. According to embodiments of this presentation, the regrown capping layer 36 functions to passivate surface traps, to prevent DC-to-RF dispersion, to increase 2DEG density in underlying epitaxial layers, and to prevent oxidation of underlying Al-containing layers.

According to embodiments of this presentation, an "N-polar" face or surface of a III-nitride semiconductor layer is the Nitrogen-polar face of the III-Nitride semiconductor layer. According to embodiments of this presentation, HEMT 30 further comprises a source (ohmic) contact layer 45 and a drain (ohmic) contact layer 46 of a further III-Nitride semiconductor, formed on a second portion 47 of the N-polar surface 40 of channel layer 32, beyond first portion 38, on opposite sides of gate trench 42. According to embodiments of this presentation, HEMT 30 further comprises a source conductor 48 and a drain conductor 49 in contact with respectively the source contact layer 45 and the drain contact layer 46. According to embodiments of this presentation, the further III-Nitride semiconductor material forming contact layers 45 and 46 is n+ doped GaN or n+ doped InGaN. As detailed hereafter, according to embodiments of this disclosure, the n+ doping concentration of the ohmic contact regions 45 and 46 can be comprised between 1×10^19 and 9×10^20 cm−3 (one times 10 to the power 19 to 9 times 10 to the power 20 per cubic cm).

Figure 3:
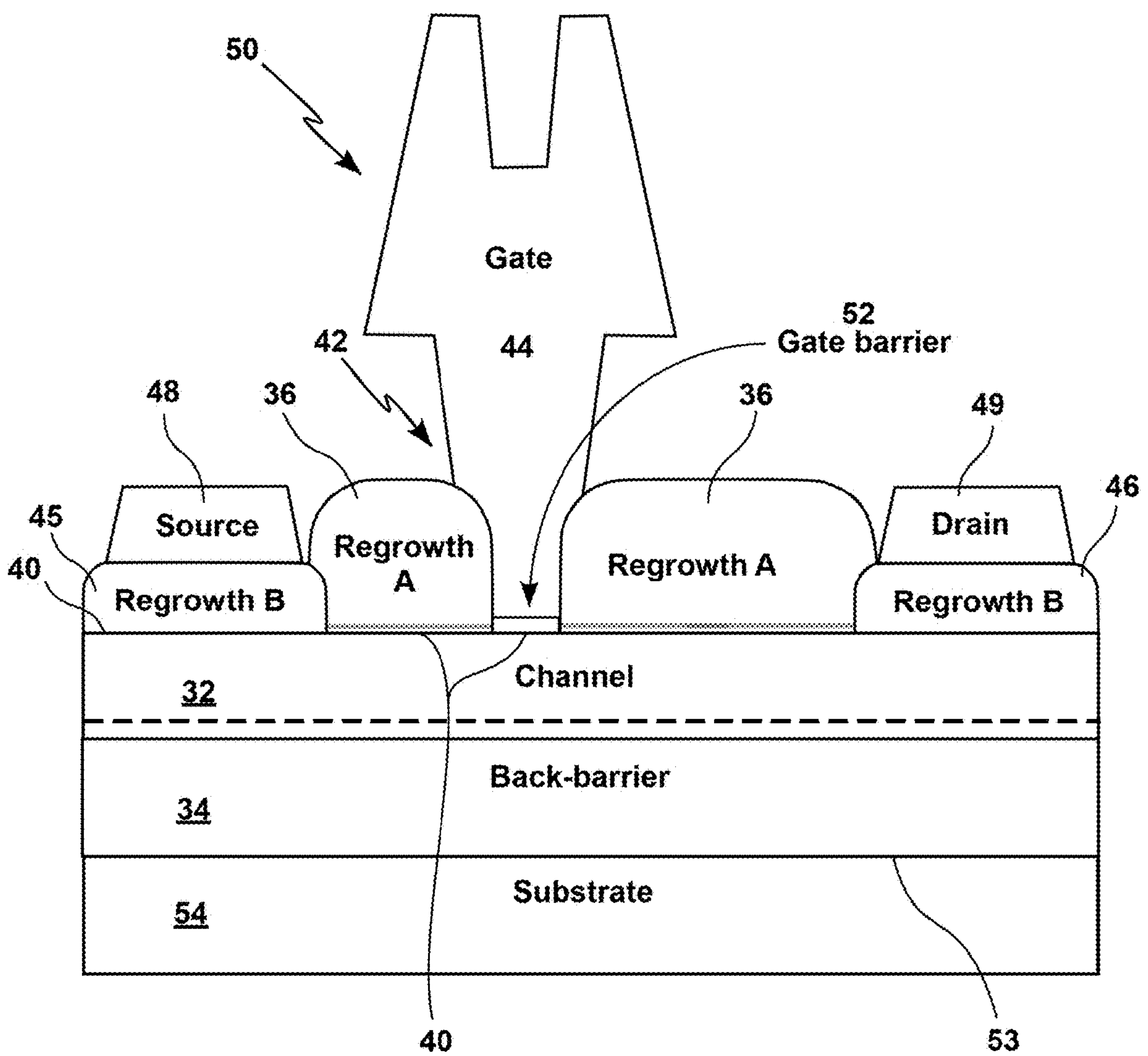
FIG. 3 illustrates an embodiment of a HEMT according to this presentation.
Figure 4:
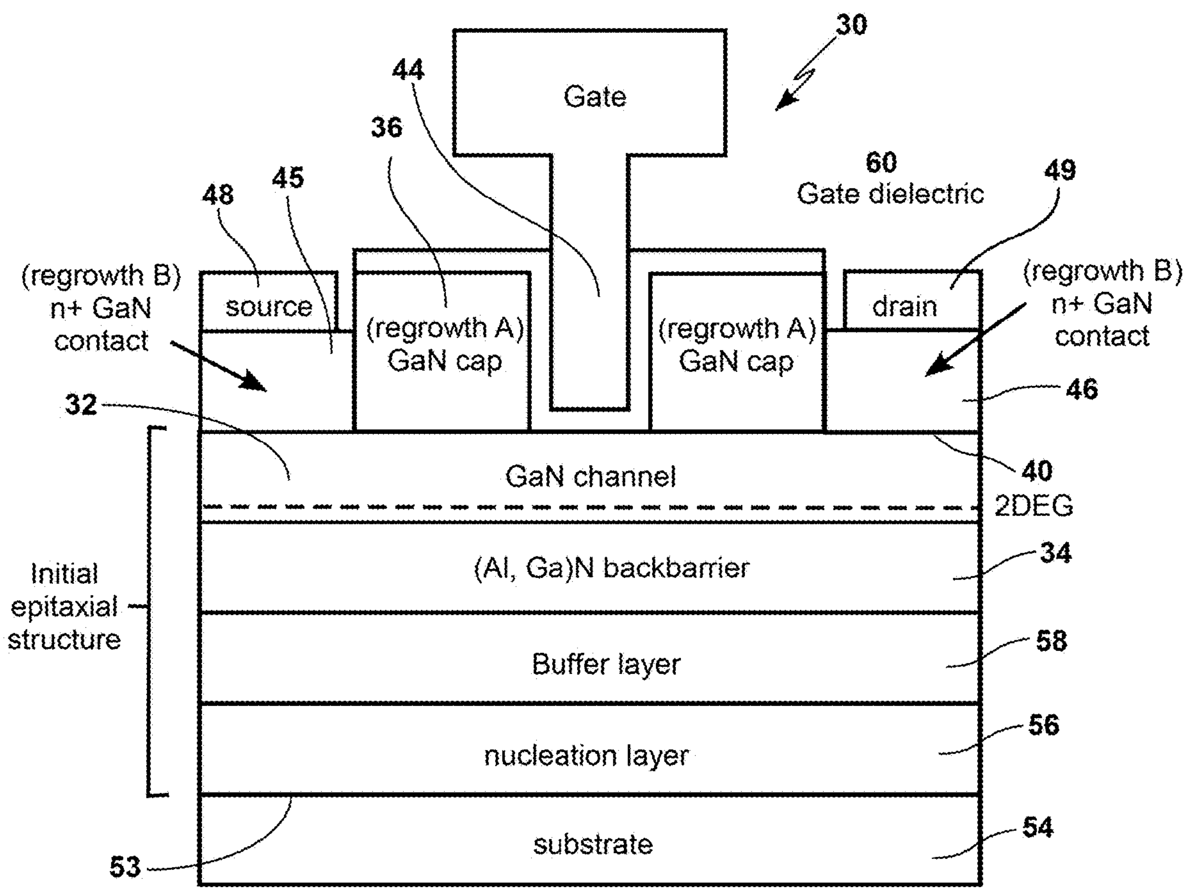
FIG. 4 illustrates an embodiment of the HEMT of FIG. 2.

According to embodiments of this presentation, the gate conductor 44 is part of a "T-shape" gate structure (or "T-gate") as for example illustrated in FIG. 4 hereafter, where a top portion of the gate structure (gate head) is broader than a middle portion of the gate structure. Optionally, the gate structure may also consist of a "y-gate" ("y" shape) as for example illustrated in FIG. 3. According to embodiments of this presentation, the gate structure comprises a Pt/Au or a Ni/Au structure, or any other metallization layer used for manufacturing the HEMT. According to embodiments of this disclosure, the back barrier layer 34 of HEMT 30 can be formed on a N-polar surface 53 of a substrate 54. Substrate 54 can be SiC or Si, sapphire, GaN, AlN, diamond.

FIG. 3 illustrates an embodiment of a HEMT 50 according to this presentation, which is essentially identical to HEMT 30 of FIG. 2, but which additionally comprises a thin layer 52 ("gate barrier") of a still further III-Nitride semiconductor material (for example one of AlN, InAlN, AlGaN and InAlGaN) in the gate trench 42 between the gate conductor 44 and the N-polar surface 40 of the channel layer 32. According to embodiments of this presentation, gate barrier 52 is a coherently-strained epitaxial layer. According to embodiments of this presentation, gate barrier 52 improves the channel mobility and the blocking of charge from the gate. According to embodiments of this disclosure, the back barrier layer 34 of HEMT 50 can be formed on a N-polar surface 53 of a substrate 54. Substrate 54 can be SiC or Si, sapphire, GaN, AlN, diamond. According to embodiments of this presentation, a nucleation layer (not shown in FIG. 2 or 3) can be formed on top of and in contact with the N-polar surface 53 of the substrate 54, and a buffer layer (not shown in FIG. 2 or 3) can be formed on top of and in contact with the nucleation layer below the barrier layer 34.

FIG. 4 illustrates an embodiment of a HEMT 30' similar to HEMT 30 of FIG. 2, additionally showing a nucleation layer 56 formed on top of and in contact with the N-polar surface 53 of the substrate 54, and a buffer layer 58 formed on top of and in contact with the nucleation layer 56, before forming the barrier layer 34 on top of and in contact with the buffer layer 58. HEMT 30' can optionally comprise a gate dielectric/insulator layer 60 that lines at least the sides and bottom of the gate conductor 44 in the gate trench. Optionally, the insulator layer 60 can also cover the top surface of the cap layer 36. According to embodiments of this presentation, gate dielectric 60 can comprise a layer of SiN or $Al_2O_3$, or of AlN, HfO2, SiO2, or some combination thereof.

Figure 5:
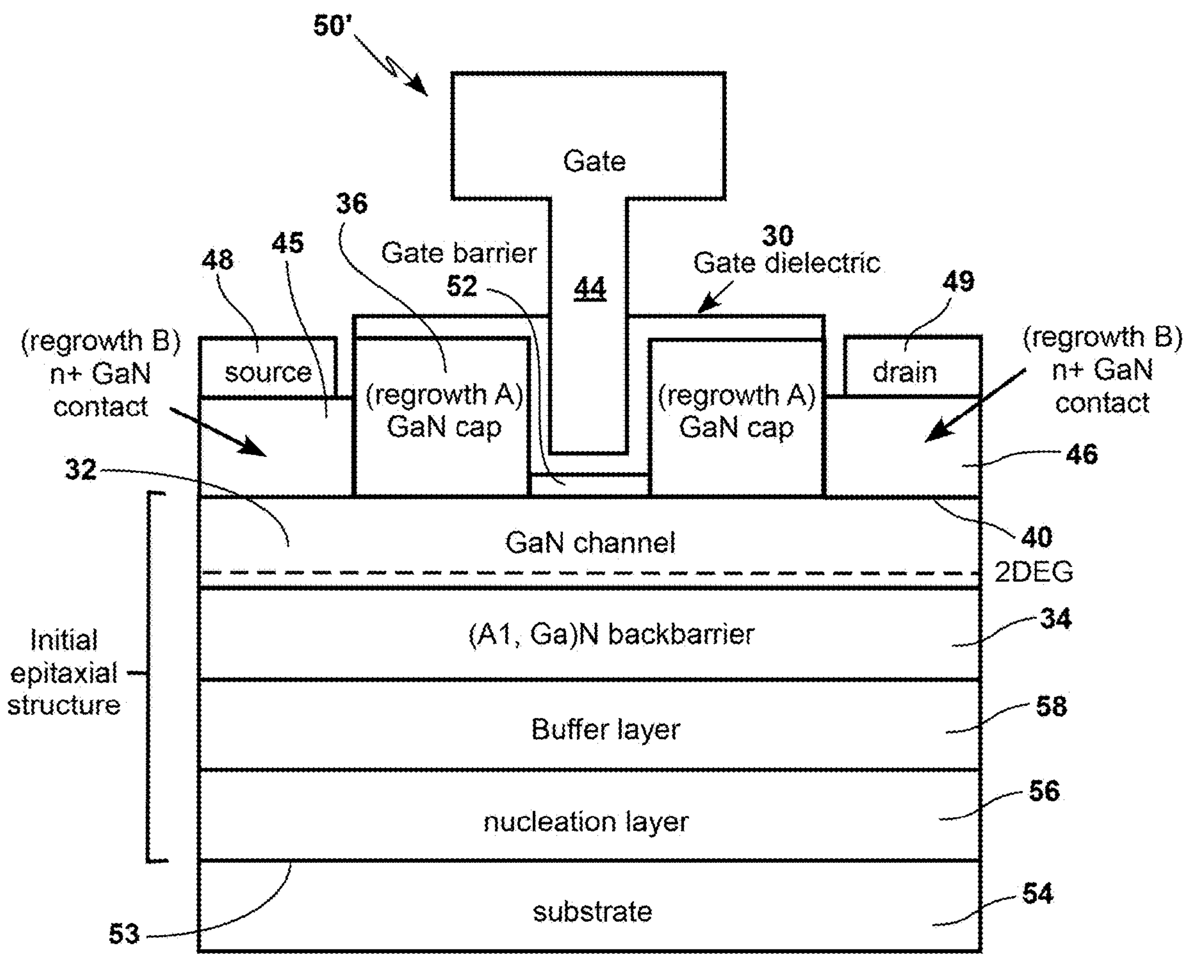
FIG. 5 illustrates an embodiment of the HEMT of FIG. 3.

FIG. 5 illustrates a HEMT 50' similar to the HEMT 50 of FIG. 3, additionally showing a nucleation layer 56 formed on top of and in contact with the N-polar surface 53 of the substrate 54, and a buffer layer 58 formed on top of and in contact with the nucleation layer 56 before forming the barrier layer 34 on top of and in contact with the buffer layer 58. HEMT 50' can optionally comprise a gate dielectric/insulator layer 60 as the one described in relation with FIG. 4.

Figure 6A:
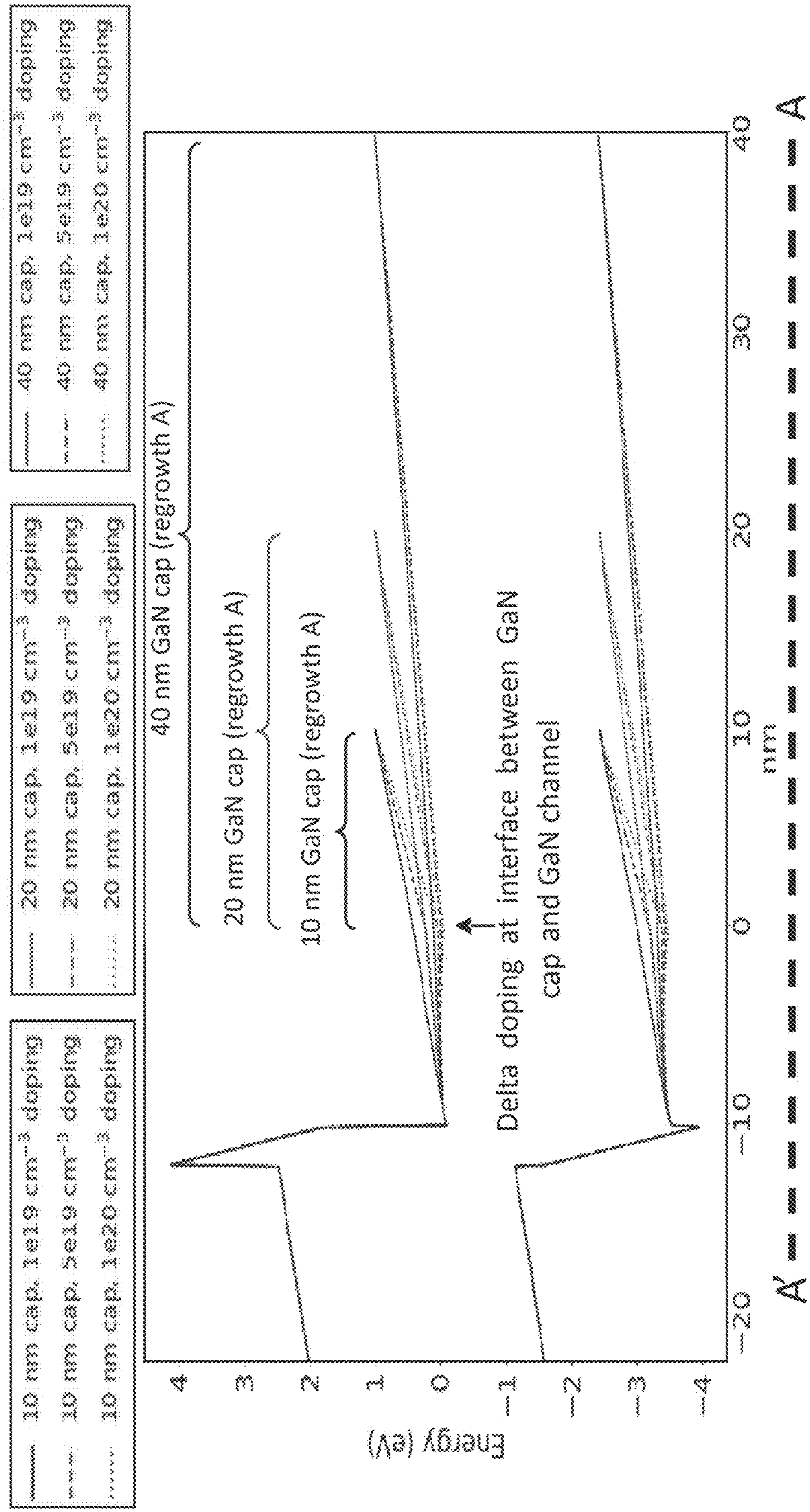
FIGS. 6A and 6B show band diagram simulations through an access region of a HEMT according to embodiments of this presentation.
Figure 6B:
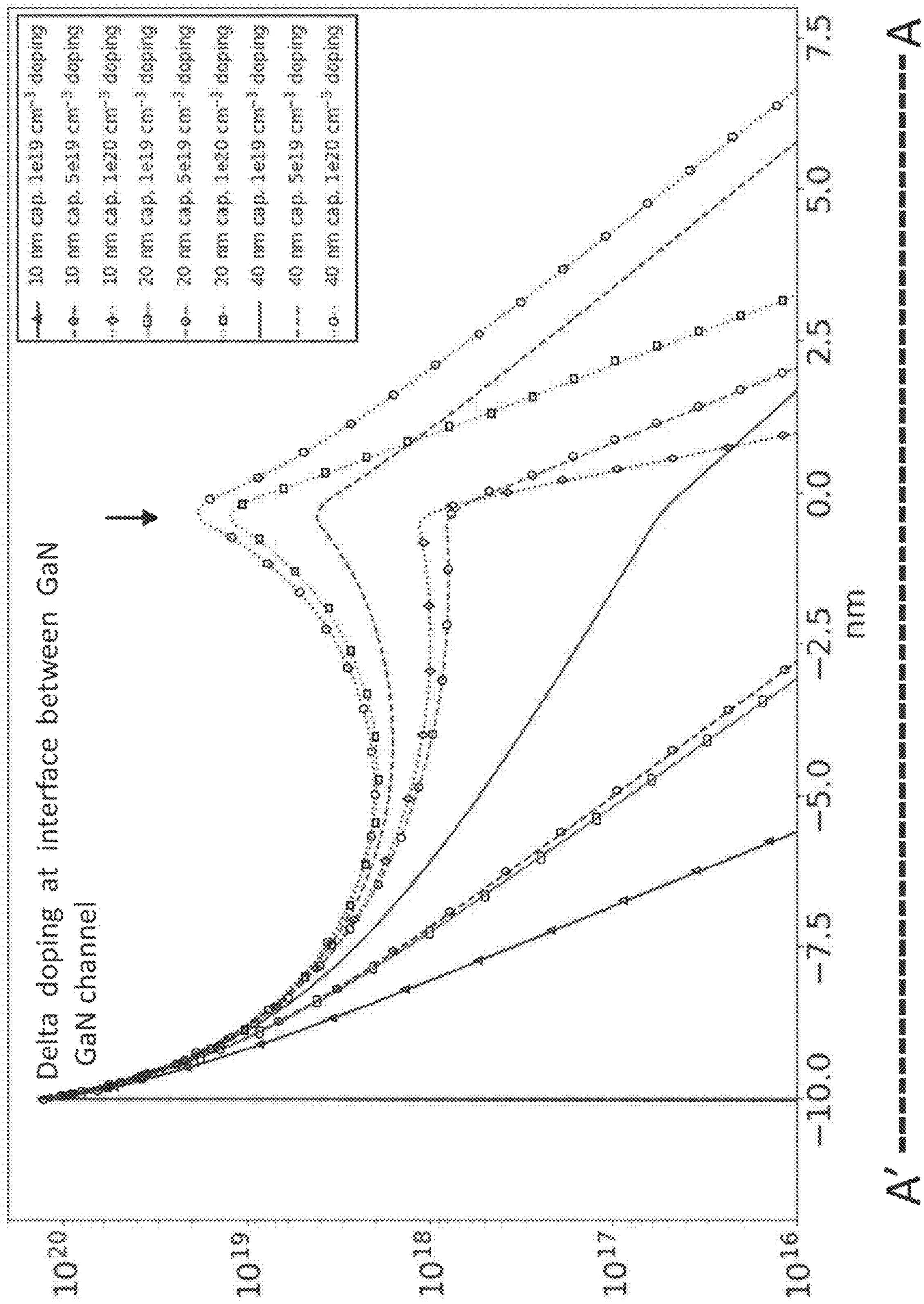

FIGS. 6A and 6B show band diagram simulations through an access region (region between gate and source, simulations made at the dashed line mark A-A' illustrated in FIG.

7) of a HEMT 30' according to embodiments of this presentation. Band diagrams are shown for three different GaN cap thicknesses (10, 20, and 40 nm) and three different Si delta-doping levels ($10^{19}$ cm−3, $5\cdot10^{19}$ cm−3 and $10^{20}$ cm−3). As illustrated in FIG. 6A, both the Si delta doping and the thickness of the regrowth layer A (GaN cap) shape the electric field in the channel access region in a manner that for example increases charge during dc conditions. FIG. 6B illustrates the changes of the charge in a portion of the access region. The result of increased charge is a reduction in parasitic access resistance and an increase in drain current. The increased charge from electric field shaping also screens the effect of the traps that cause undesirable current collapse during operation. The net result of this electric field shaping is higher device output power.

As illustrated in FIGS. 6A and 6B, and because there is no semiconductor (AlGaN) etch stop to pull up the conduction band, contrary to what happened in the prior art HEMT of e.g. FIG. 1B, a HEMT according to this presentation shows a higher 2DEG density in the access regions relative to the prior art, which allows increasing the current and power in the device. As outlined above, Si delta doping may be used at the termination of the GaN channel layer of the initial epitaxial structure or at the beginning of a regrowth step to intentionally shape the electric fields near the channel and in the access regions near the gate. Delta-Doping is a technique, usually used in MOCVD growth, that can be used to get thin layers of high dopant concentration or, if combined with annealing, to get homogeneous doping with very high dopant concentration. A delta-doping procedure can consist of multiple growth steps, where the host material and dopant sources are opened intermittently. Process variants leave the host material source open all the time and just open/close the dopant source. This process allows obtaining relatively thick nominally undoped layers interrupted by relatively thin layers with very high dopant concentration.

Figure 7:
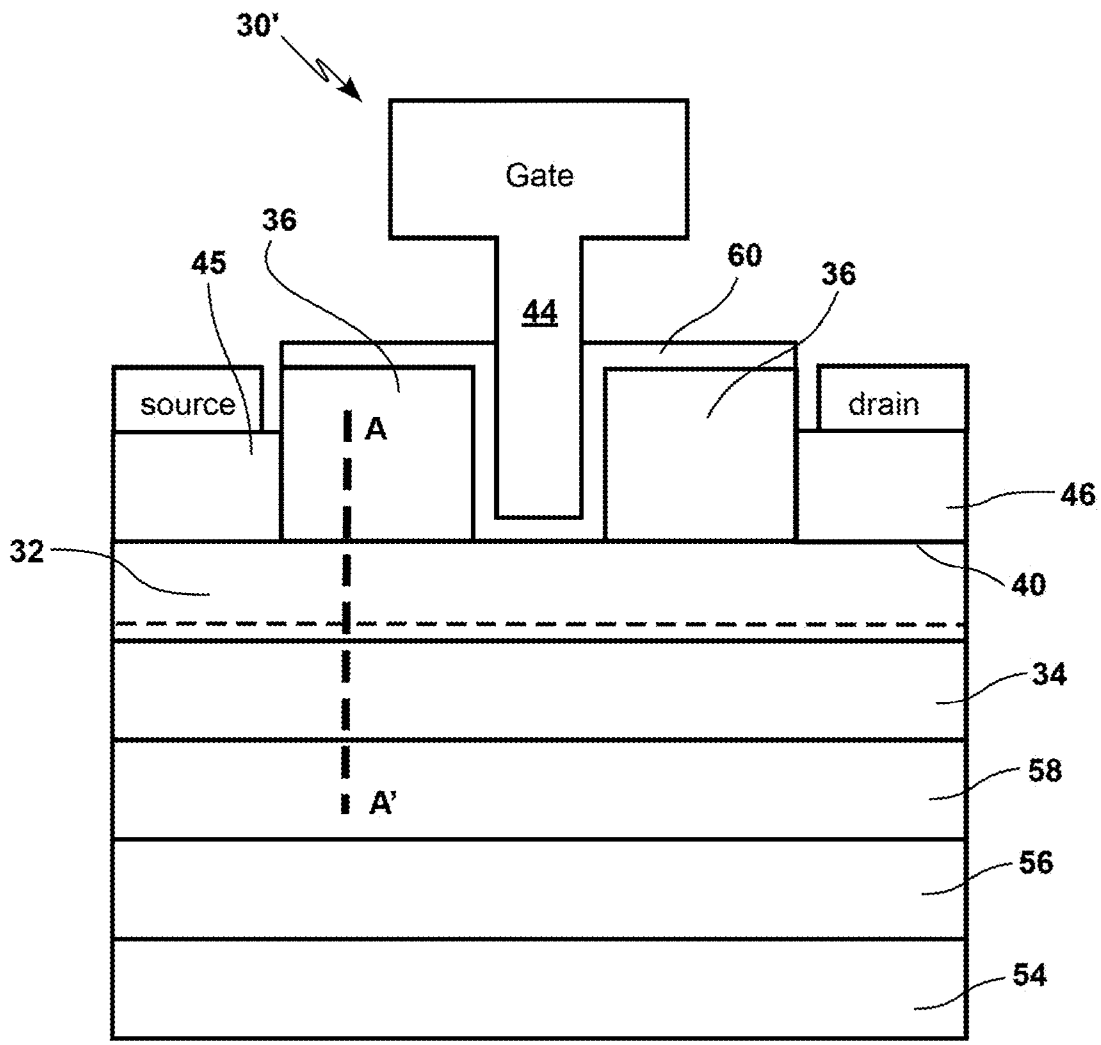
FIG. 7 shows the location of the access region used for generating FIG. 6.

FIG. 7 shows with a dashed line A-A' the location of the access region of a HEMT 30' according to this presentation, used for generating the band diagram simulations of FIGS. 6A and 6B.

Figures 8A, 8B, 8C, 8D, 8E, 8F:
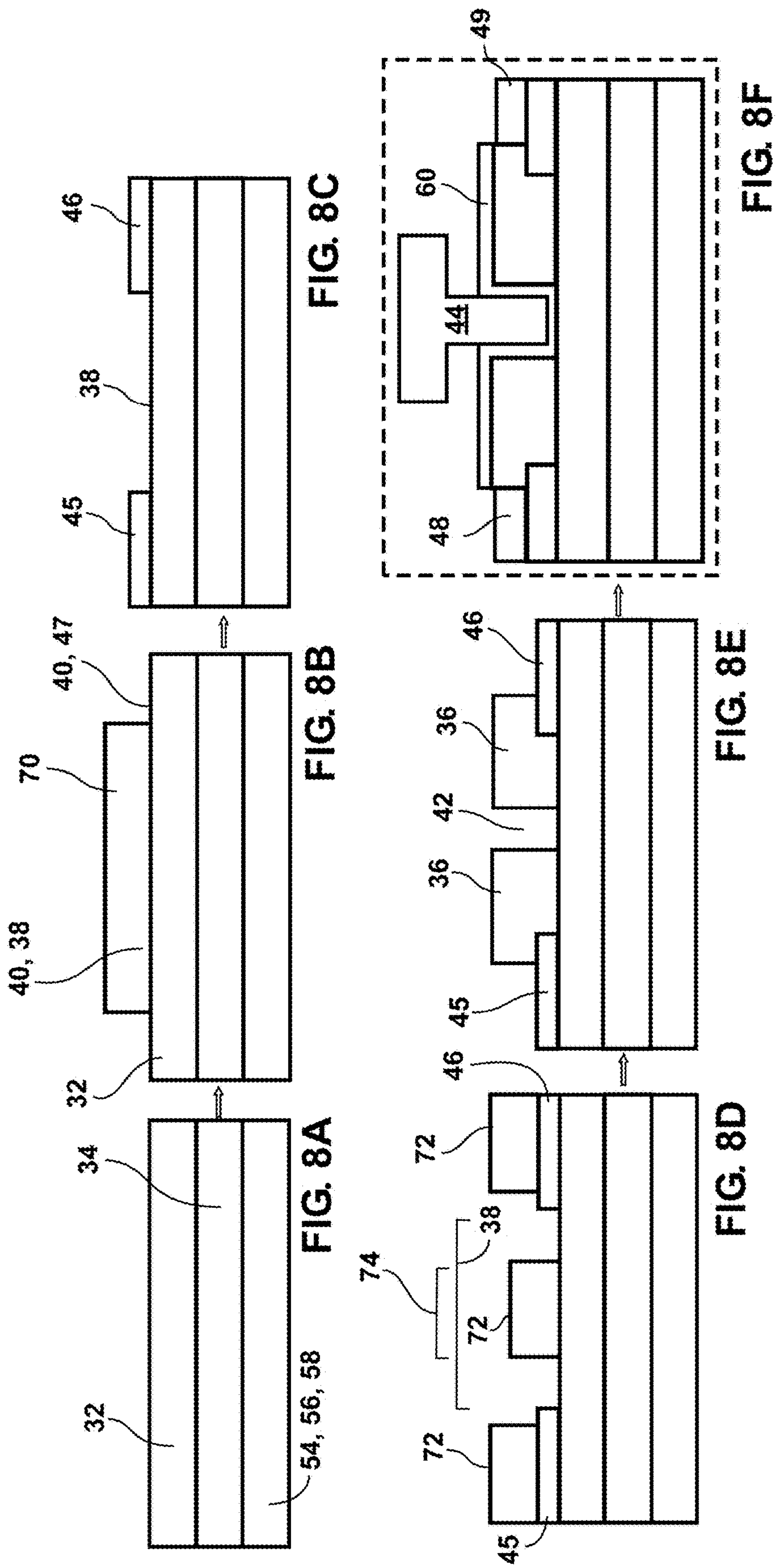
FIGS. 8A to 8F illustrate fabrication steps of the HEMT of FIG. 4.

FIGS. 8A to 8F illustrate steps of a method of fabrication of the HEMT 30' of FIG. 4, the method including: forming channel layer 32 (of the first III-Nitride semiconductor material) on the N-polar surface of back barrier layer 34 (of the second III-Nitride semiconductor material), itself formed on the substrate 54 and eventually buffer layer 58 and nucleation layer 56. According to embodiments of this presentation, these first steps equate to forming a first epitaxial structure (FIG. 8A).

According to embodiments of this presentation, the method further comprises forming source contact layer 45 and drain contact layer 46 (of the fourth III-V semiconductor) on a portion 47 of the N-polar surface 40 of the channel layer 32, by forming on said N-polar surface 40 a contacts mask 70 exposing said portion 47 of N-polar surface 40, but masking a portion 38 of N-polar surface 40 (FIG. 8B). Source contact layer 45 and drain contact layer 46 are then regrown (grown epitaxially) on the exposed portion 47 of surface 40; then mask 70 is removed (FIG. 8C).

According to embodiments of this presentation, the method further comprises forming a capping layer mask 72 exposing portion 38 of surface 40, except a gate region 74 of surface 40, located within portion 38. According to embodiments of this presentation, mask 72 is also arranged to expose small sections of source contact layer 45 and drain contact layer 46 neighboring the portion 38 of surface 40 (FIG. 8D).

According to embodiments of this presentation, the method further comprises growing capping layer 36 on top of and in contact with portion 38 of surface 40 (as well as on top of the sections of contact layer 45 and drain contact layer 46 left exposed by mask 72; then and removing mask 72 (FIG. 8E). According to embodiments of this presentation, the method removing of mask 72 notably forms the gate trench 42 that traverses capping layer 36 and ends at surface 40.

The method can then comprise finalizing HEMT 30', by filling gate trench 42 with gate conductor 44, eventually after forming a gate dielectric 60 on the bottom and edges of the gate trench (and eventually on top of capping layer 36, as illustrated); as well as by forming source conductor 48 and drain conductor 49 (FIG. 8F). As outlined above, gate conductor 44 can be part of a "T-shaped gate" as shown in FIG. 8.

It is to be noted that the forming of the source and drain contacts 45, 46 can alternatively take place after the forming of the capping layer 36. In such an embodiment, mask 72 only covers the gate region 74 and the capping layer is also formed in areas where the source and drain contacts are to be formed. Mask 70 is then formed on top of the capping layer to etch the capping layer and free the areas where the source and drain contacts 45, 46 are then formed. According to embodiments of this presentation, etch of the capping layer can be performed using dry plasma etching. The masks are arranged such that no gap exists at the interface between capping layer 36 and source contact layer 45 or at the interface between capping layer 36 and drain contact layer 46.

According to embodiments of this presentation, channel layer 32 has a first doping level, source and drain contact layers 45, 46 have a second doping level larger than the first doping level, and capping layer 36 has the first doping level.

Figures 9A, 9B, 9C, 9D, 9E, 9F, 9G, 9H:
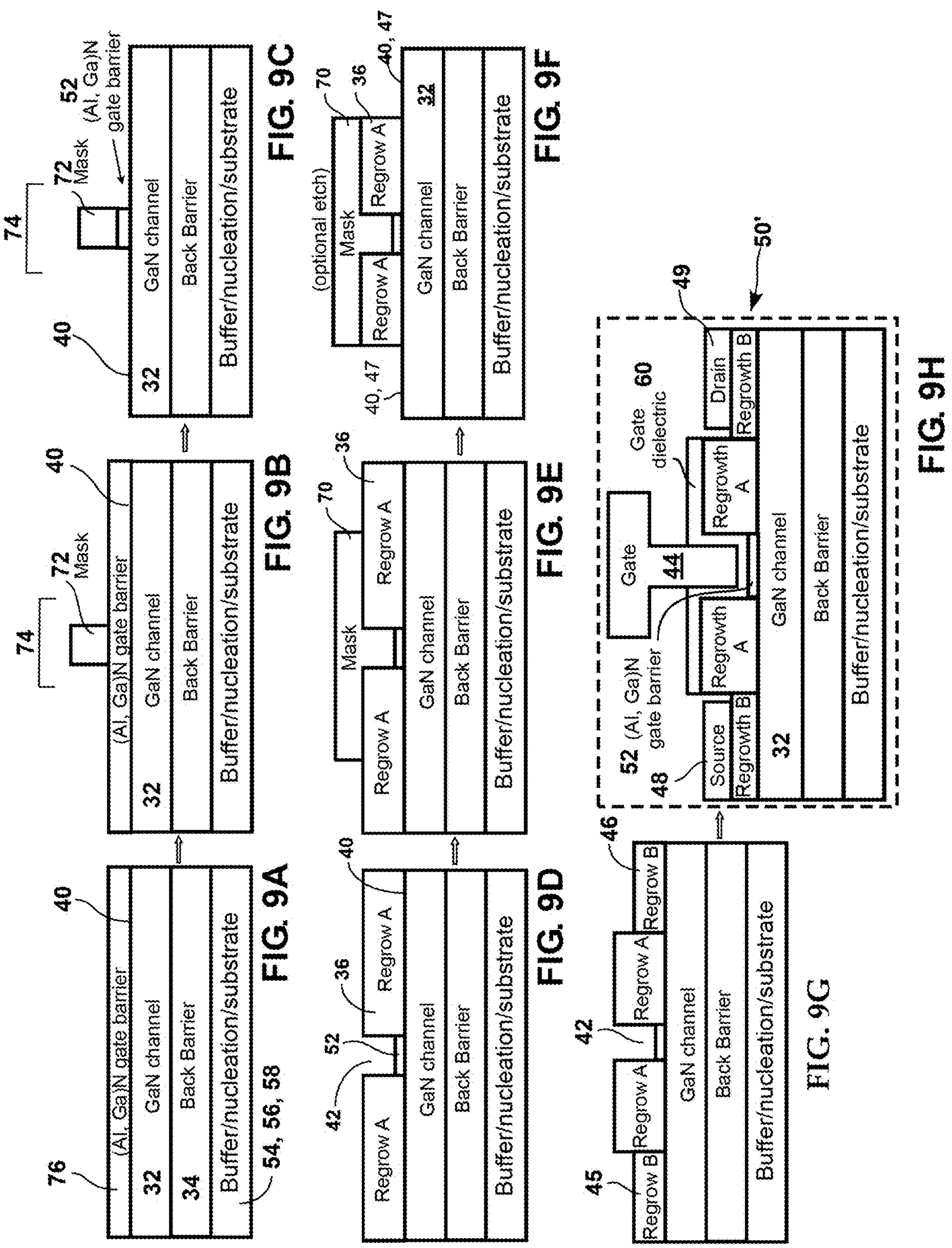
FIGS. 9A to 9H illustrate fabrication steps of the HEMT of FIG. 5.

FIGS. 9A to 9H illustrate fabrication steps of the HEMT 50' of FIG. 5, the method including, as in FIGS. 8A to 8F, forming a first epitaxial structure comprising channel layer 32 on the N-polar surface of back barrier layer 34, itself on the substrate 54 and eventually buffer layer 58 and nucleation layer 56. Further, according to this embodiment, a gate barrier layer 76 (e.g. AlGaN) is formed on top of channel layer 32 (FIG. 9A).

According to embodiments of this presentation, the method further comprises forming a capping layer mask 72 above a gate region 74 of surface 40 of channel layer 32. (FIG. 9B). The method then comprises etching away gate barrier layer 76 using mask 72, thus forming gate barrier 52 above gate region 74. (FIG. 9C).

According to embodiments of this presentation, the method further comprises growing capping layer 36 everywhere on top surface 40 (except on the portion covered by mask 72); then removing mask 72 (FIG. 9D). According to embodiments of this presentation, the method of removing mask 72 notably forms the gate trench 42 that traverses capping layer 36 and ends at surface 40, with gate barrier 52 arranged at the bottom of trench 42 on surface 40.

According to embodiments of this presentation, the method further comprises forming source contact layer 45 and drain contact layer 46 by forming a contacts mask 70 on the capping layer 36 and the gate trench 42, exposing only portions 47 of the capping layer 36 above areas of surface 40 where the source and drain contacts are to be formed (FIG. 9E). The capping layer 36 is then etched using mask 70, thus exposing the areas of surface 40 where the source and drain contacts are to be formed (FIG. 9F). Source contact layer 45 and drain contact layer 46 are then regrown (grown epitaxially) on the exposed portion 47 of surface 40; before mask 70 is removed (FIG. 9G).

The method can then comprise finalizing HEMT 50', by filling gate trench 42 with gate conductor 44, eventually after forming a gate dielectric 60 on the bottom and edges of the gate trench (and eventually on top of capping layer 36, as illustrated); as well as by forming source conductor 48 and drain conductor 49 (FIG. 9H). As outlined above, gate conductor 44 can be part of a "T-shaped gate" as illustrated in FIG. 9.

It is to be noted that the forming of the source and drain contacts 45, 46 can alternatively take place before the forming of the capping layer 46, similarly to what is disclosed in relation with FIG. 8.

Figure 10:
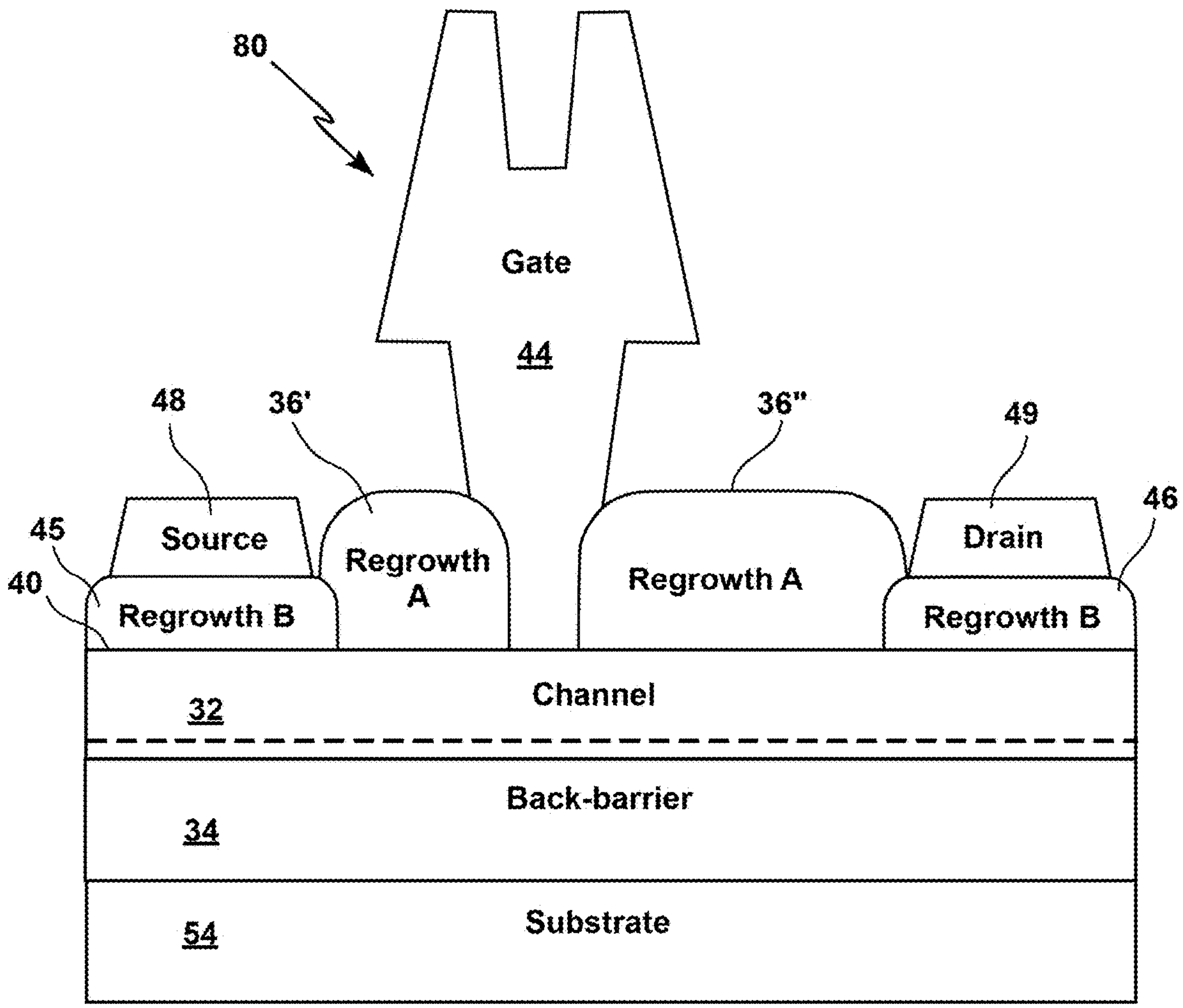
FIG. 10 illustrates an embodiment of a HEMT according to this presentation.

FIG. 10 illustrates an embodiment of a HEMT 80 according to this presentation, which is essentially identical to the HEMT 30 described above, except that the capping layer 36 between the gate 44 and the source contact layer 45 forms a source access region 36' having a given doping and the capping layer 36 between the gate 44 and the drain contact layer 46 forms a drain access region 36" having a different doping. According to this embodiment, channel layer 32 has a first doping level and source and drain contact layers 45, 46 have a second doping level larger than the first doping level, the source access region 36' has a third doping level comprised between the first and second doping levels; (i.e. a third doping level greater than the first doping level and less than the second doping level) and the drain access region 36" has the first doping level.

As outlined above, according to embodiments of this presentation, the n+ doping concentration in the ohmic contact regions 45, 46 can be between 1×10^19 and 9×10^20 cm^−3. Such heavy doping of the ohmic contact regions reduces the ohmic contact resistance. According to embodiments of this presentation, the dopant can be Si. Germanium (Ge) can also be used as an n-type dopant in GaN. According to embodiments of this presentation, channel region 32 can be "unintentionally" doped (UID), effectively having a doping concentration of between 5×1^15 and 5×10^16 cm^−3. The dopant can still be Si.

According to embodiments of this presentation, the portion of capping layer 36 referenced 36' (regrowth regions marked "Regrowth A") can have doping concentrations of between 5×10^15 and 1×10^19 cm^−3. The dopant can still be Si. According to embodiments of this presentation, the portion of capping layer referenced as 36" (the regrowth region marked "Regrowth C") can have a doping concentration of between 5×10^15 and 1×10^19 cm^−3, while being also lower than the doping concentration in capping layer portion 36', such that the resistance of capping layer 36/capping layer portion 36' is smaller than the resistance of capping layer portion 36", thus allowing to have a higher breakdown voltage in capping layer portion 36" than in capping layer portion 36'. The dopant can still be Si.

Figure 11:
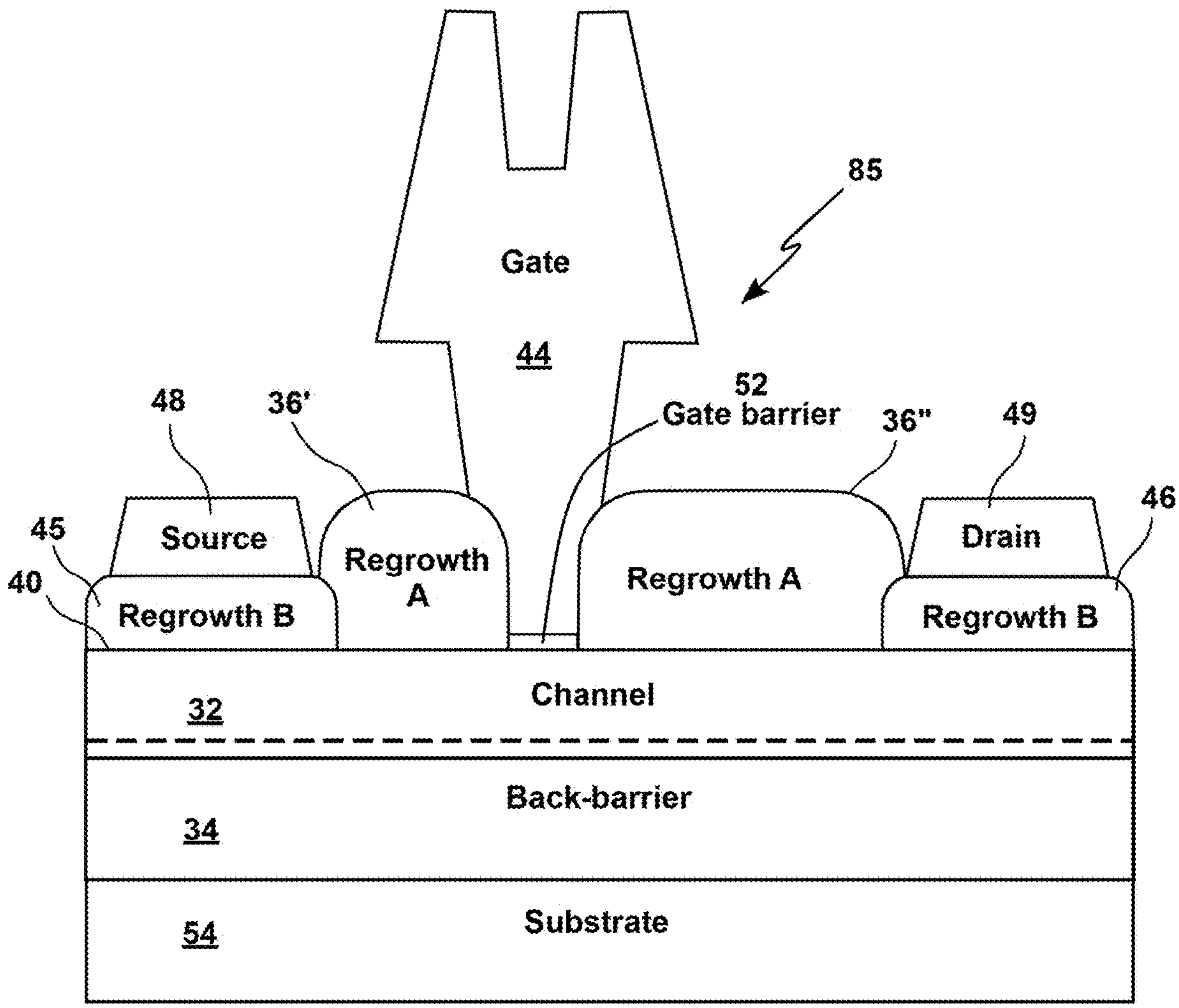
FIG. 11 illustrates an embodiment of a HEMT according to this presentation.

FIG. 11 illustrates an embodiment of a HEMT 85 according to this presentation, which is essentially identical to the HEMT 50 described above, except that the capping layer 36 between the gate 44 and the source contact layer 45 forms a source access region 36' having a given doping and the capping layer 36 between the gate 44 and the drain contact layer 46 forms a drain access region 36" having a different doping, as described above in relation to FIG. 10.

Figures 12A, 12B, 12C, 12D, 12E, 12F, 12G, 12H:
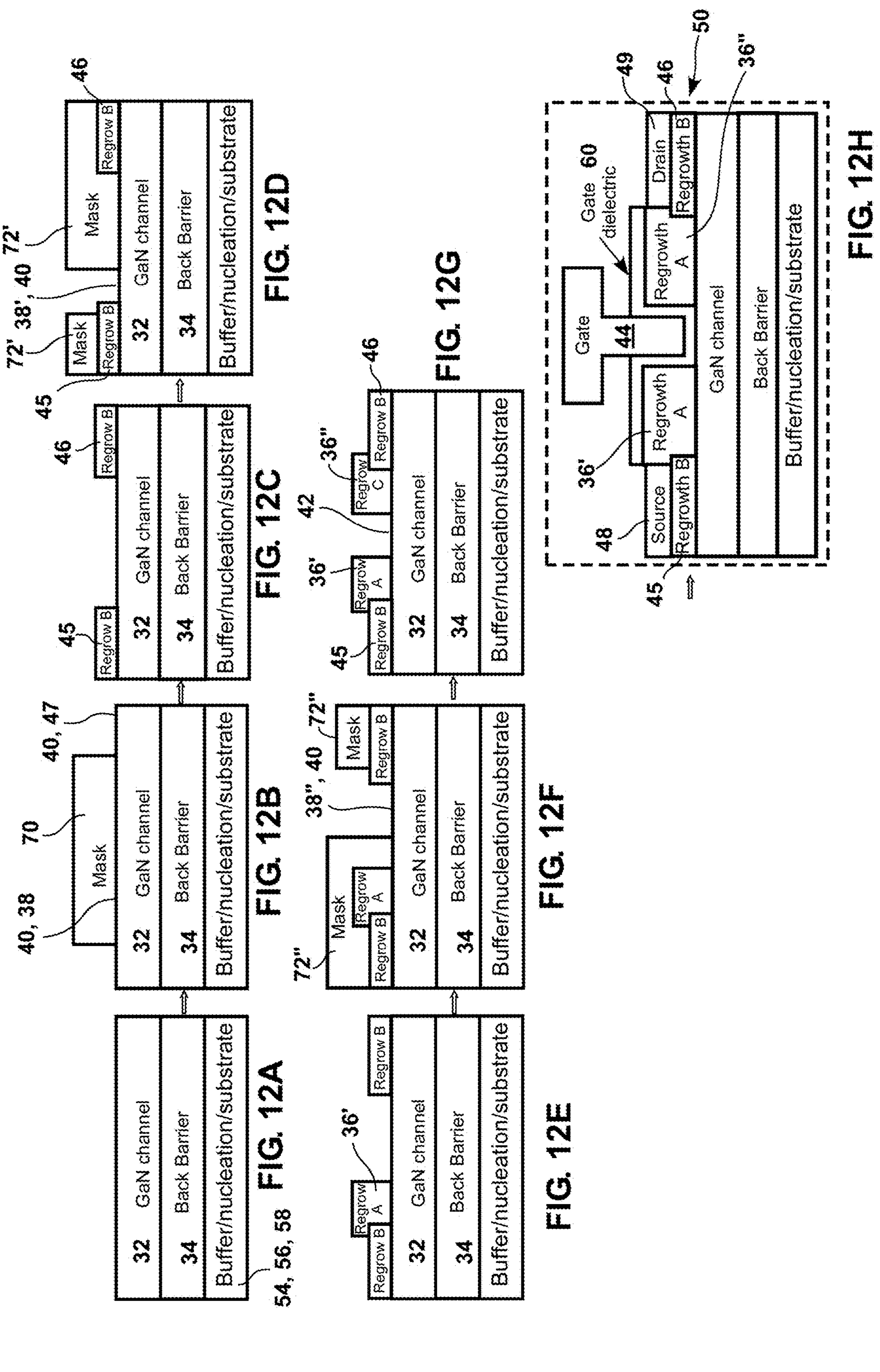
FIGS. 12A to 12H illustrate fabrication steps of the HEMT of FIG. 10.

FIGS. 12A to 12H illustrate fabrication steps of a HEMT similar to HEMT 80 of FIG. 10. The three first steps in FIGS. 12A, 12B, 12C are identical to the three first steps detailed in FIGS. 8A, 8B, 8C. According to this embodiment of the presentation, however, the forming a capping layer mask 72 is different from the one described in relation with FIG. 8D. According to this embodiment, the forming a capping layer mask 72 comprises: initially forming a first half mask 72' exposing only a portion 38' of surface 40 where access region 36' of the capping layer 36 is to be formed (FIG. 12D); and then forming access region 36' on portion 38' of surface 40 and removing half mask 72' (FIG. 12E). As illustrated, half mask 72' can be arranged such that access region 36' overlaps slightly the source contact layer 45. According to this embodiment of the presentation, the forming of a capping layer mask 72 further comprises then forming a second half mask 72" exposing only a portion 38" of surface 40 where access region 36" of the capping layer 36 is to be formed (FIG. 12F), and then forming access region 36" on portion 38" of surface 40 and removing half mask 72" (FIG. 12G). As illustrated, half mask 72" can be arranged such that access region 36" overlaps slightly drain contact layer 46. It is noted that removing half mask 72" causes the gate trench 42 to appear between access regions 36' and 36". The gate dimension in this process depends on both the size and alignment of portions 72', 72" of mask 72.

The method can then comprise finalizing HEMT 80, by filling gate trench 42 with gate conductor 44, eventually after forming a gate dielectric 60 on the bottom and edges of the gate trench 42; as well as by forming source conductor 48 and drain conductor 49 (FIG. 12H). As outlined above, gate conductor 44 can be part of a "T-shaped gate" as shown in FIG. 12G.

It is to be noted that the forming of the source and drain contacts 45, 46, can alternatively take place after the forming of the capping layer 46, as previously described in relation with FIG. 8.

Figures 13A, 13B, 13C, 13D, 13E, 13F, 13G, 13H, 13I, 13J:
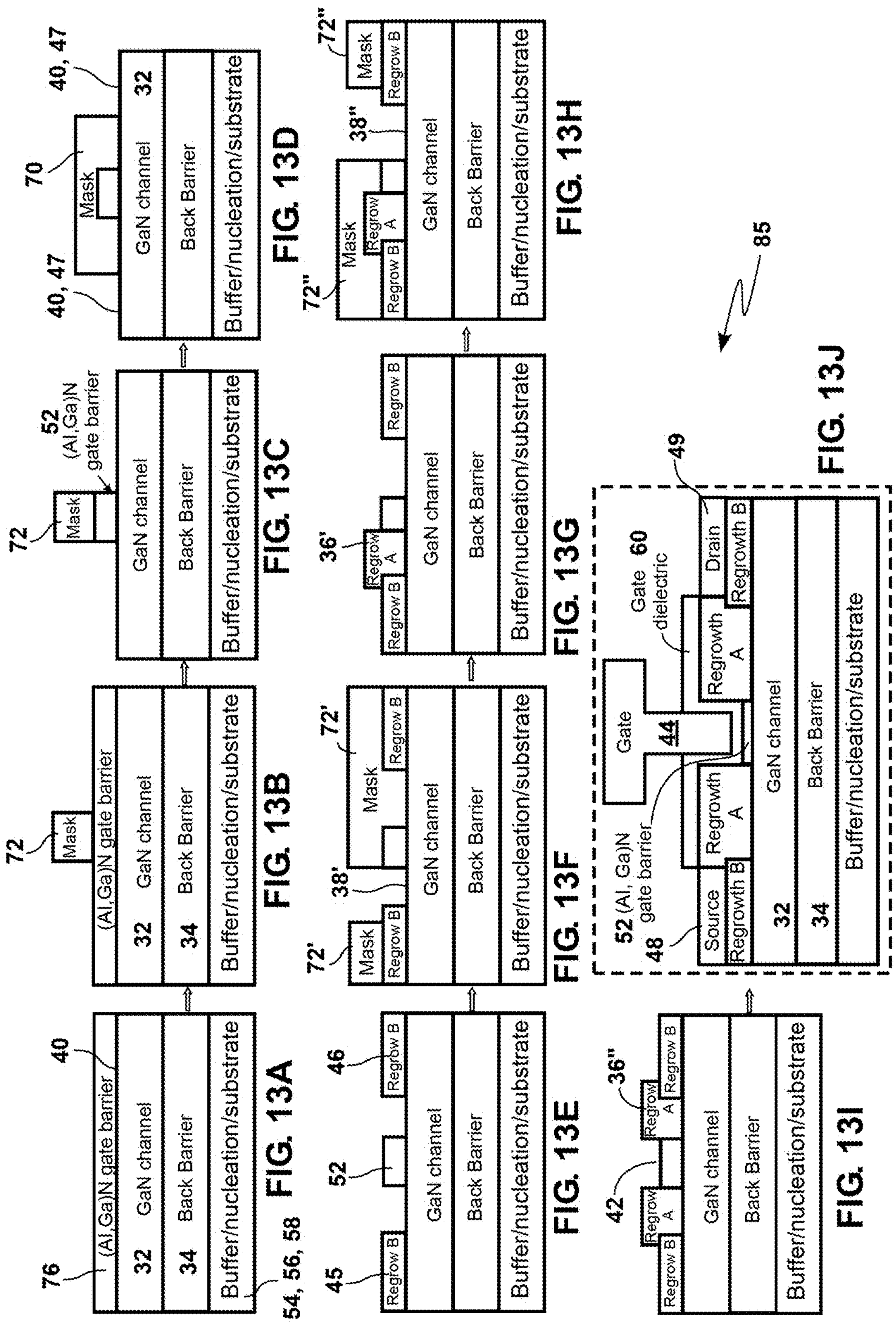
FIGS. 13A to 13J illustrate fabrication steps of the HEMT of FIG. 11.

FIGS. 13A to 13J illustrate fabrication steps of a HEMT similar to the HEMT 85 of FIG. 11. The three first steps in FIGS. 13A, 13B, 13C are identical to the three first steps of FIGS. 9A, 9B, 9C as detailed above. According to this embodiment of the presentation, however, after etching away the gate barrier layer 76 using mask 72 and forming gate barrier 52 (FIG. 13C), mask 72 is removed and a contact layer mask 70 is formed above gate barrier 52, exposing only portions 47 of the N-polar surface 40 of channel 32 where the source and drain contact layers are to be formed (FIG. 13D). The method further comprises forming source contact layer 45 and drain contact layer 46 on the exposed portions 47, and removing mask 70 (FIG. 13E). The method then comprises, consistently with FIG. 12, forming a first half mask 72' exposing only a portion 38' of surface 40 where access region 36' of the capping layer 36 is to be formed (FIG. 13F), and then forming access region 36' on portion 38' of surface 40 and removing half mask 72' (FIG. 13G). As illustrated, half mask 72' can be arranged such that access region 36' overlaps slightly source contact layer 45 and contacts laterally gate barrier 52. According to this embodiment of the presentation, the method further comprises forming a second half mask 72" exposing only a portion 38" of surface 40 where access region 36" of the capping layer 36 is to be formed (FIG. 13H), and then forming access region 36" on portion 38" of surface 40 and removing half mask 72" (FIG. 13I). As illustrated, half mask 72" can be arranged such that access region 36" overlaps slightly drain contact layer 46 and contacts laterally gate barrier 52. It is noted that removing half mask 72" causes the gate trench 42 to appear between access regions 36' and 36", with gate barrier 52 on the bottom of gate trench 42. The method can then comprise finalizing HEMT 85, by filling gate trench 42 with gate conductor 44, eventually after forming an optional gate dielectric 60 on the bottom and edges of the gate trench 42; as well as by forming source conductor 48 and drain conductor 49 (FIG. 13J). As outlined above, gate conductor 44 can be part of a "T-shaped gate" as shown in FIG. 13.

It is to be noted that the forming of the source and drain contacts 45, 46, can alternatively take place after the forming of the capping layer 46, as previously described in relation with FIG. 8.

Figure 14:
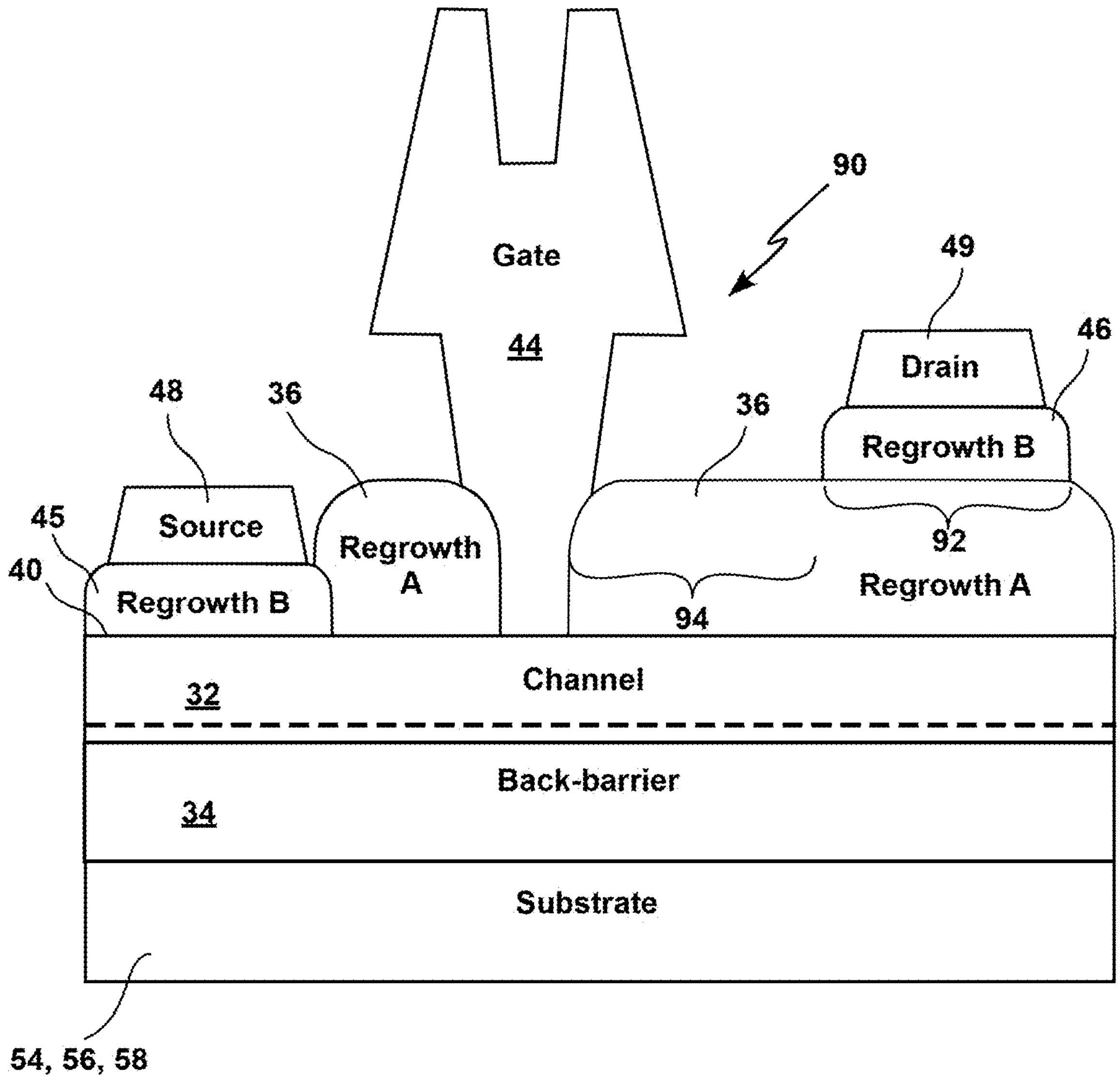
FIG. 14 illustrates an embodiment of a HEMT according to this presentation.

FIG. 14 illustrates an embodiment of a HEMT 90 according to this presentation, which can be structurally identical to the HEMT 30 of FIG. 2, except that instead of having a drain contact layer 46 on surface 40, HEMT 90 comprises a drain contact layer 46' formed on a portion 92 of a top surface of capping layer 36 arranged at a predetermined distance 94 from the gate 44. The capping layer 36 of HEMT 90 can be longer on the drain side than the capping layer 36 of HEMT 30; and the portion of capping layer 36 between gate 44 and drain contact layer 46' forms a drain access region of HEMT 90. Consistently with the structure of HEMT 30, a drain conductor 49 is formed on top of drain contact layer 46'. According to embodiments of this presentation, the drain access region of HEMT 90 can allow electric fields to have higher breakdown voltage than in the drain access region of HEMT 30. The drain access region of HEMT 90 can thus allow higher breakdown voltage and reduce dc-RF dispersion as the device is self-passivated by the capping layer 36. According to an embodiment of this presentation, the portions of capping layer 36 on the side of the source and on the side of the drain can be grown in the same way as respectively portions 36', 36" as detailed in relation with FIG. 10, so as to have a lower doping level of capping layer 36 on the side of the drain.

Figure 15:
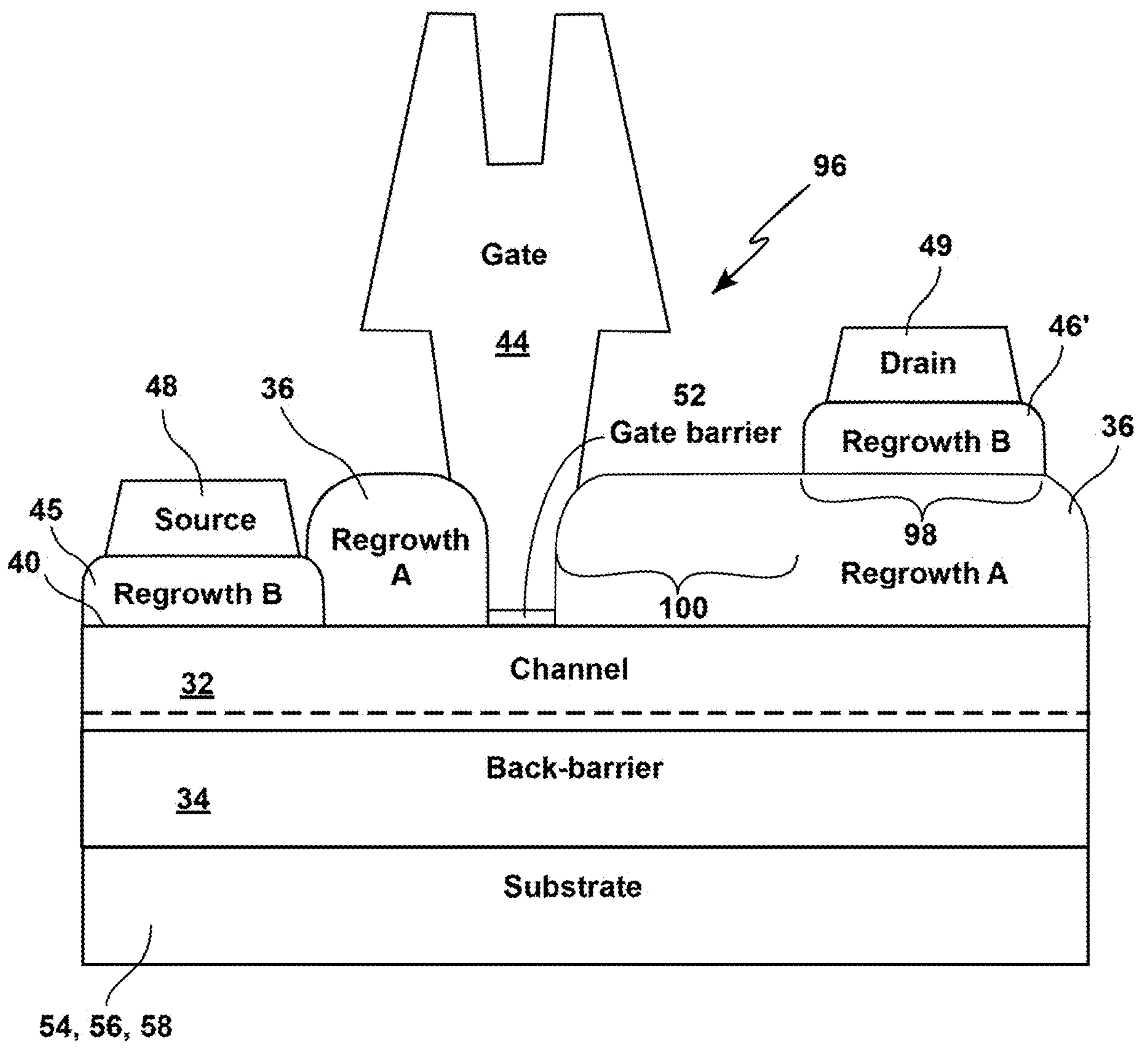
FIG. 15 illustrates an embodiment of a HEMT according to this presentation.

FIG. 15 illustrates an embodiment of a HEMT 96 according to this presentation, which can be structurally identical to the HEMT 50 of FIG. 3, except that instead of having a drain contact layer 46 on surface 40, HEMT 96 comprises a drain contact layer 46" formed on a portion 98 of a top surface of capping layer 36 arranged at a predetermined distance 100 from the gate 44. The capping layer 36 of HEMT 96 can be longer on the drain side than the capping layer 36 of HEMT 50; and the portion of capping layer 36 between gate 44 and drain contact layer 46" forms a drain access region of HEMT 96. According to embodiments of this presentation, the drain access region of HEMT 96 can allow electric fields to have higher breakdown voltage than in the drain access region of HEMT 50. The drain access region of HEMT 96 can thus allow higher breakdown voltage and reduce dc-RF dispersion as the device is self-passivated by the capping layer 36. According to an embodiment of this presentation, the portions of capping layer 36 on the side of the source and on the side of the drain can be grown in the same way as respectively portions 36', 36" as detailed in relation with FIG. 10, so as to have a lower doping level of capping layer 36 on the side of the drain.

Figures 16A, 16B, 16C, 16D, 16E, 16F:
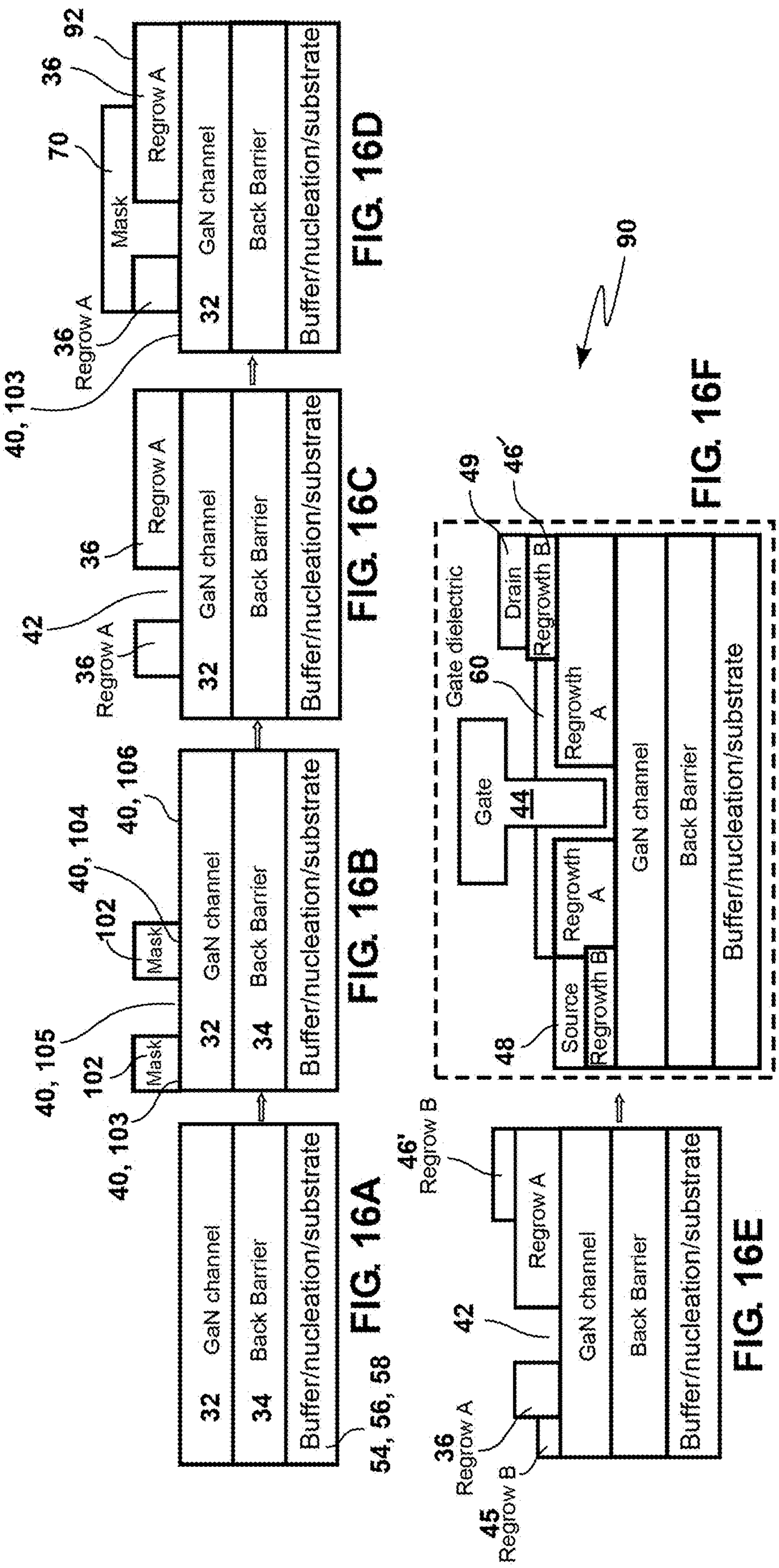
FIGS. 16A to 16F illustrate fabrication steps of the HEMT of FIG. 14.

FIGS. 16A to 16F illustrate steps of a fabrication method of the HEMT 90 of FIG. 14. According to embodiments of this presentation, a first step in FIG. 16A of this method is identical to the first step of the method illustrated in FIG. 8A. The method further comprises forming on top of surface 40 a mask 102 masking portions 103, 104 of surface 40 that are destined to receive source contact layer 45 and gate 44, and exposing portions 105, 106 of surface 40 that are destined to receive capping layer 36 on both sides (source and drain) of where gate 44 will stand (FIG. 16B). The method further comprises growing capping layer 36 on portions 105, 106 of surface 40, on both sides of where gate 44 will stand, and removing mask 102, thus exposing temporarily gate trench 42 (FIG. 16C). The method further comprises growing a contacts mask 70 above capping layer 36 on portions 105 of surface 40, above gate trench 42, and above a section of capping layer 36 on portion 106 of surface 40 so as to expose portion 92 of the top surface of capping layer 36 that is on portion 106 of surface 40 (FIG. 16D).

The method further comprises growing simultaneously source contact layer 45 on portion 103 of surface 40 and drain contact layer 46' on portion 92 of the top surface of capping layer 36, on portion 106 of surface 40, then removing mask 70 (FIG. 16E). Removing mask 70 exposes gate trench 42. The method can then comprise finalizing HEMT 90, by filling gate trench 42 with gate conductor 44, eventually after forming an optional gate dielectric 60 on the bottom and edges of the gate trench 42; as well as by forming source conductor 48 and drain conductor 49 (FIG. 16F). As outlined above, gate conductor 44 can be part of a "T-shaped gate" as shown in FIG. 16F.

Figures 17A, 17B, 17C, 17D, 17E, 17F, 17G, 17H:
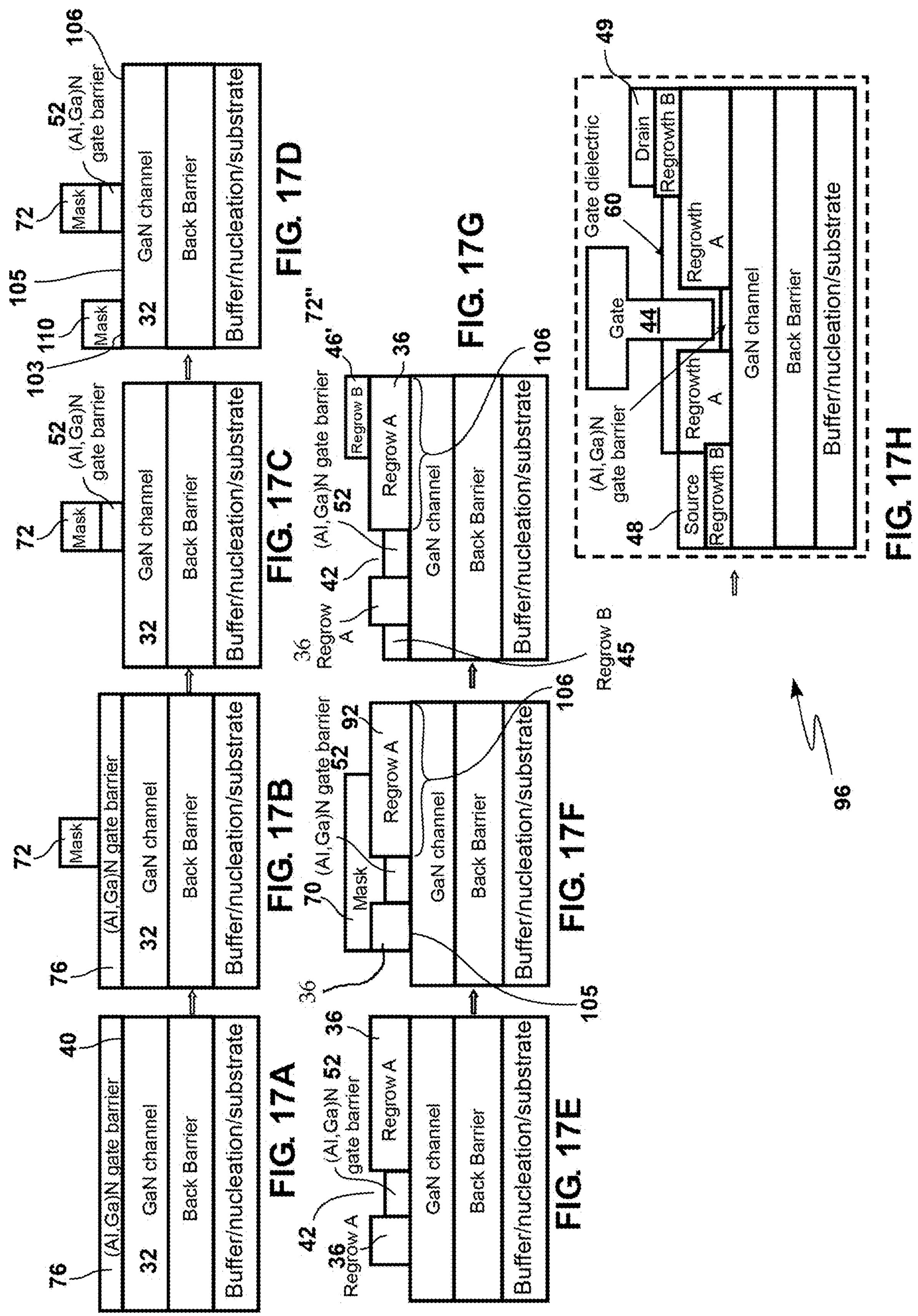
FIGS. 17A to 17H illustrate fabrication steps of the HEMT of FIG. 15.

FIGS. 17A to 17H illustrate fabrication steps of a HEMT similar to the HEMT 96 of FIG. 15. The three first steps, illustrated in FIGS. 17A, 17B, 17C, are identical to the three first steps illustrated in FIGS. 9A, 9B, 9C as detailed above. According to this embodiment of the presentation, however, after etching away the gate barrier layer 76 using mask 72 and forming gate barrier 52 (FIG. 17C), mask 72 is not removed and mask 110 is formed, additionally masking a portion 103 of surface 40 destined to receive source contact layer 45 and exposing portions 105, 106 of surface 40 destined to receive capping layer 36 on both sides (source, drain) of gate barrier 52 (FIG. 17D). The method further comprises growing capping layer 36 on portions 105, 106 of surface 40 on both sides of gate barrier 52, and removing masks 72 and 110 (FIG. 17E). The method further comprises growing a contacts mask 70 above capping layer 36 on portion 105 of surface 40, above gate barrier 52, and above a section of capping layer 36 on portion 106 of surface 40 so as to expose portion 92 of the top surface of capping layer 36 on portion 106 of surface 40 (FIG. 17F).

The method further comprises growing simultaneously source contact layer 45 on portion 103 of surface 40 and drain contact layer 46' on portion 92 of the top surface of capping layer 36 on portion 106 of surface 40, then removing mask 70 (FIG. 17G). Removing mask 70 exposes gate barrier 52 in gate trench 42. The method can then comprise finalizing HEMT 96, by filling gate trench 42 with gate conductor 44, eventually after forming an optional gate dielectric 60 on the bottom and edges of the gate trench 42; as well as by forming source conductor 48 and drain conductor 49 (FIG. 17H). As outlined above, gate conductor 44 can be part of a "T-shaped gate" as shown in FIG. 17H.

Figure 18:
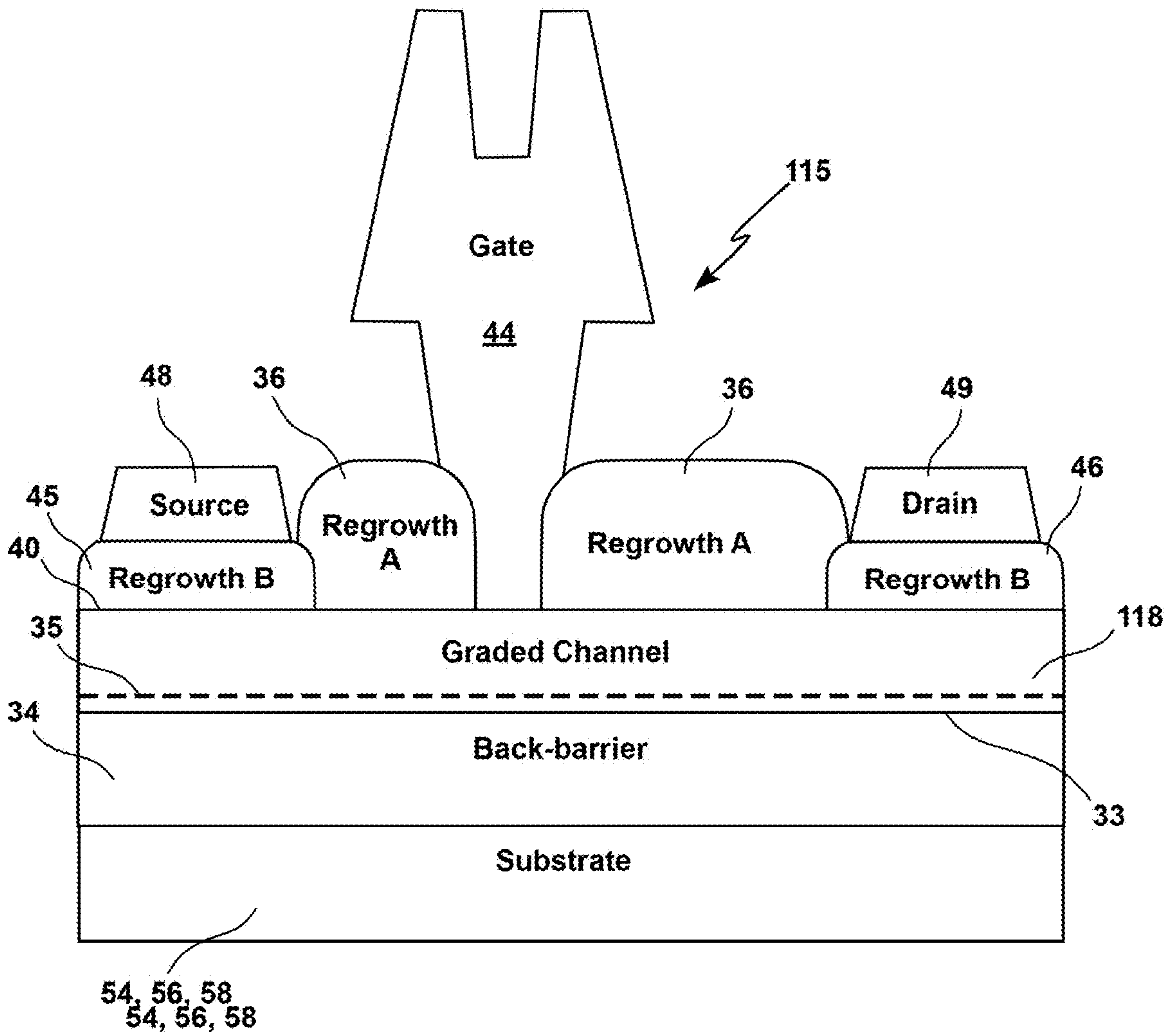
FIG. 18 illustrates an embodiment of a HEMT according to this presentation.

FIG. 18 illustrates an embodiment of a HEMT 115 according to this presentation, which is essentially identical to HEMT 30 of FIG. 2, except that instead of having a monolithic channel layer 32, HEMT 115 comprises a graded channel layer 118 (Specifically: a compositionally graded channel layer 118, whose composition (e.g., Al mole fraction in AlGaN) varies along its thickness). A graded channel layer increases the vertical thickness of the two-dimensional electron gas and moves the centroid of charge away from the heterostructure interface. This allows the HEMT transconductance to remain high at broader range of drain currents, which increases device linearity and high-frequency operating range. A graded channel is for example achieved by making a gradual transition from the AlGaN barrier layer to the GaN channel during epitaxial growth.

Figure 19:
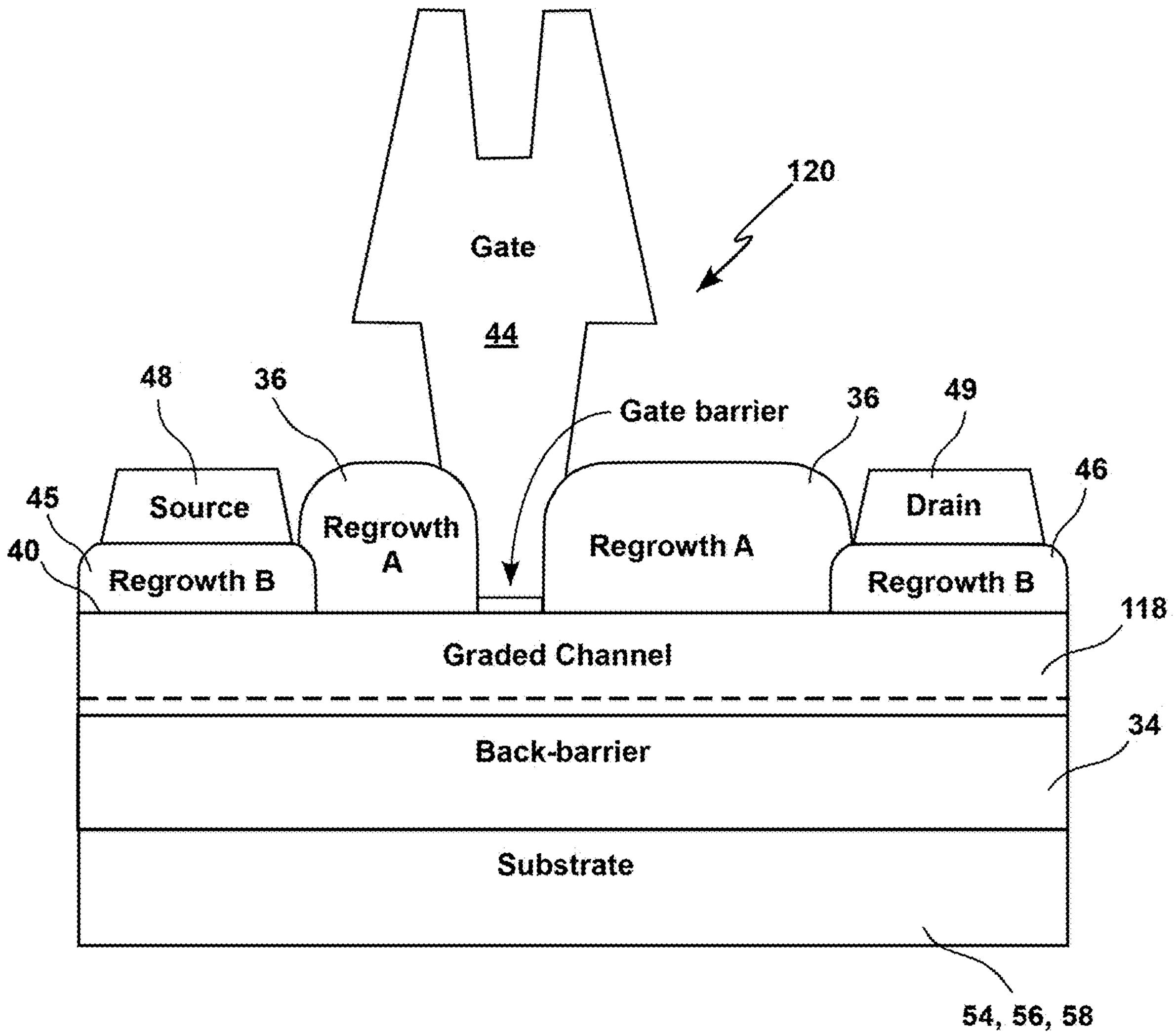
FIG. 19 illustrates an embodiment of a HEMT according to this presentation.
Figures 20A, 20B, 20C, 20D, 20E, 20F:
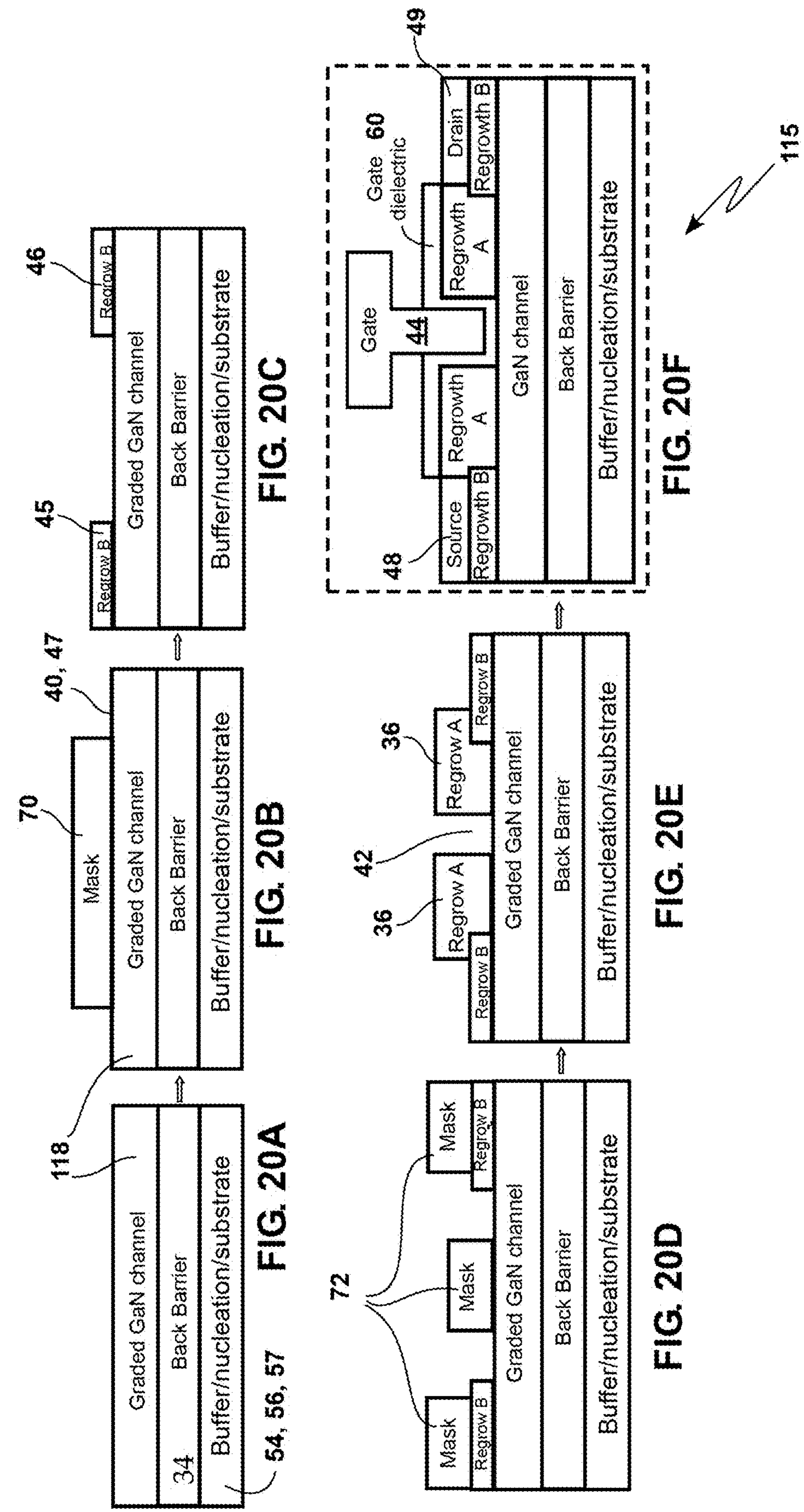
FIGS. 20A to 20F illustrate fabrication steps of the HEMT of FIG. 18.
Figures 21A, 21B, 21C, 21D, 21E, 21F, 21G, 21H:
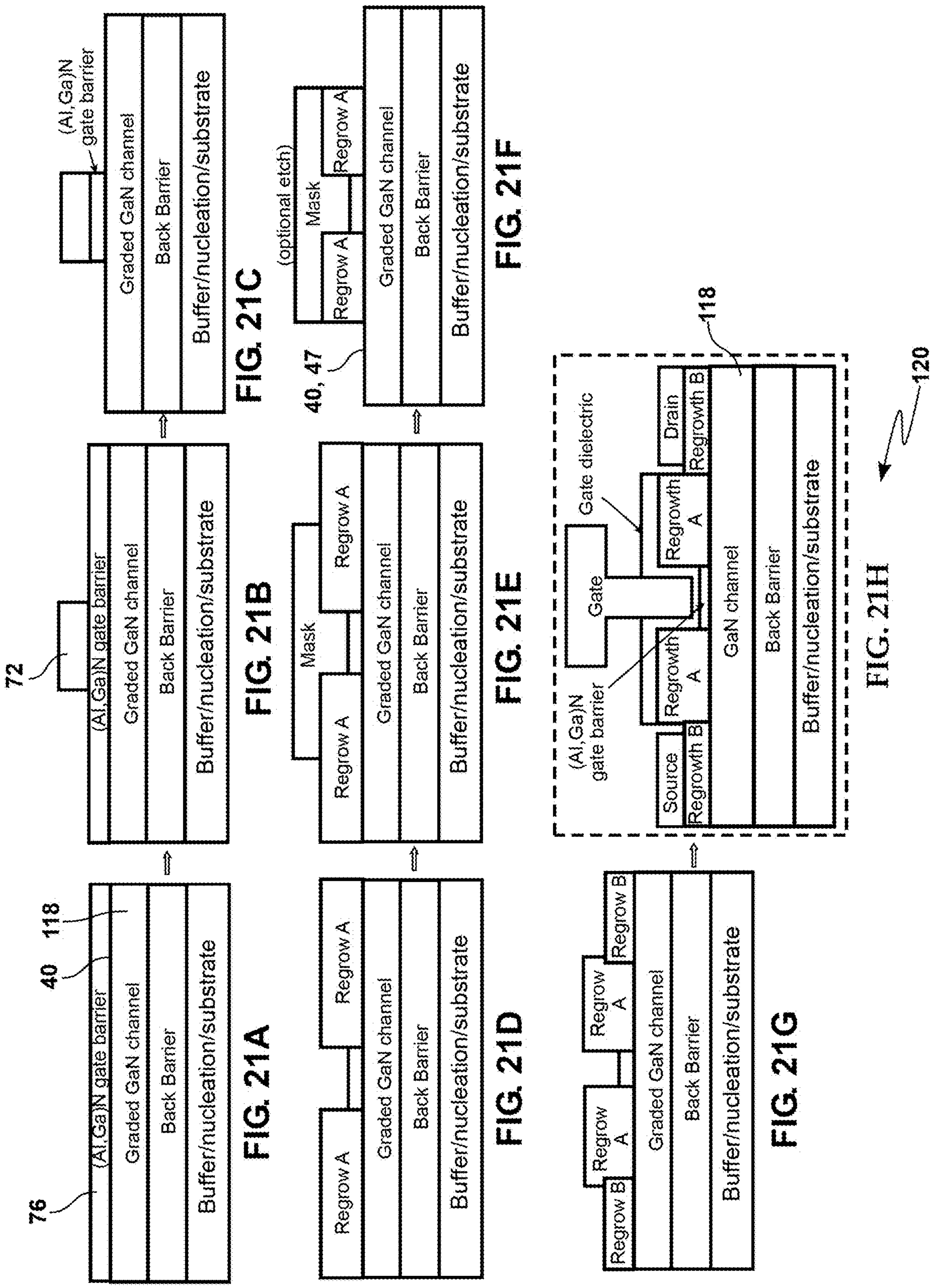
FIGS. 21A to 21H illustrate fabrication steps of the HEMT of FIG. 19.

FIG. 19 illustrates an embodiment of a HEMT 120 according to this presentation, which is essentially identical to HEMT 50 of FIG. 3, except that instead of having a monolithic channel layer 32, HEMT 115 comprises a graded channel layer 118 such as described in FIG. 18. As for FIG. 18, a graded channel layer increases the vertical thickness of the two-dimensional electron gas and moves the centroid of charge away from the heterostructure interface. This allows the HEMT transconductance to remain high at broader range of drain currents, which increases device linearity and high-frequency operating range. A graded channel is achieved by making a gradual transition from the AlGaN barrier layer to the GaN channel during epitaxial growth.

FIGS. 20A to 20F illustrate fabrication steps of the HEMT 115 of FIG. 18. According to embodiments of this presentation, the method of fabrication of HEMT 115 can be identical to the method of fabrication of HEMT 30, except that at the end of the first step (FIG. 20A), a graded channel layer 118 is grown instead of channel layer 32. It is noted that HEMT 115, as shown in FIG. 18, does not comprise the optional gate dielectric 60 shown in FIG. 20F.

FIGS. 21A to 21E illustrate fabrication steps of the HEMT 120 of FIG. 19. According to embodiments of this presentation, the method of fabrication of HEMT 120 can be identical to the method of fabrication of HEMT 50, except that at the end of the first step (FIG. 21A), a graded channel layer 118 is grown instead of channel layer 32. It is noted that HEMT 120, as shown in FIG. 19, does not comprise the optional gate dielectric 60 shown in FIG. 21E.

According to embodiments of this presentation, in the above-described methods of fabrication the regions not intended to see regrowth can be masked with SiO2 and regrowth can be performed by molecular beam epitaxy, before removing the SiO2 masks. Alternate masks, growth techniques, and process flows can be used as well (for example SiN masks or metal-organic chemical vapor phase deposition growth). The devices discussed here can use SiN gate dielectric under the gate metal, and optionally over the final regrowth cap layers as additional surface passivation, but alternate surface passivation or treatments may also be used.

Figure 22:
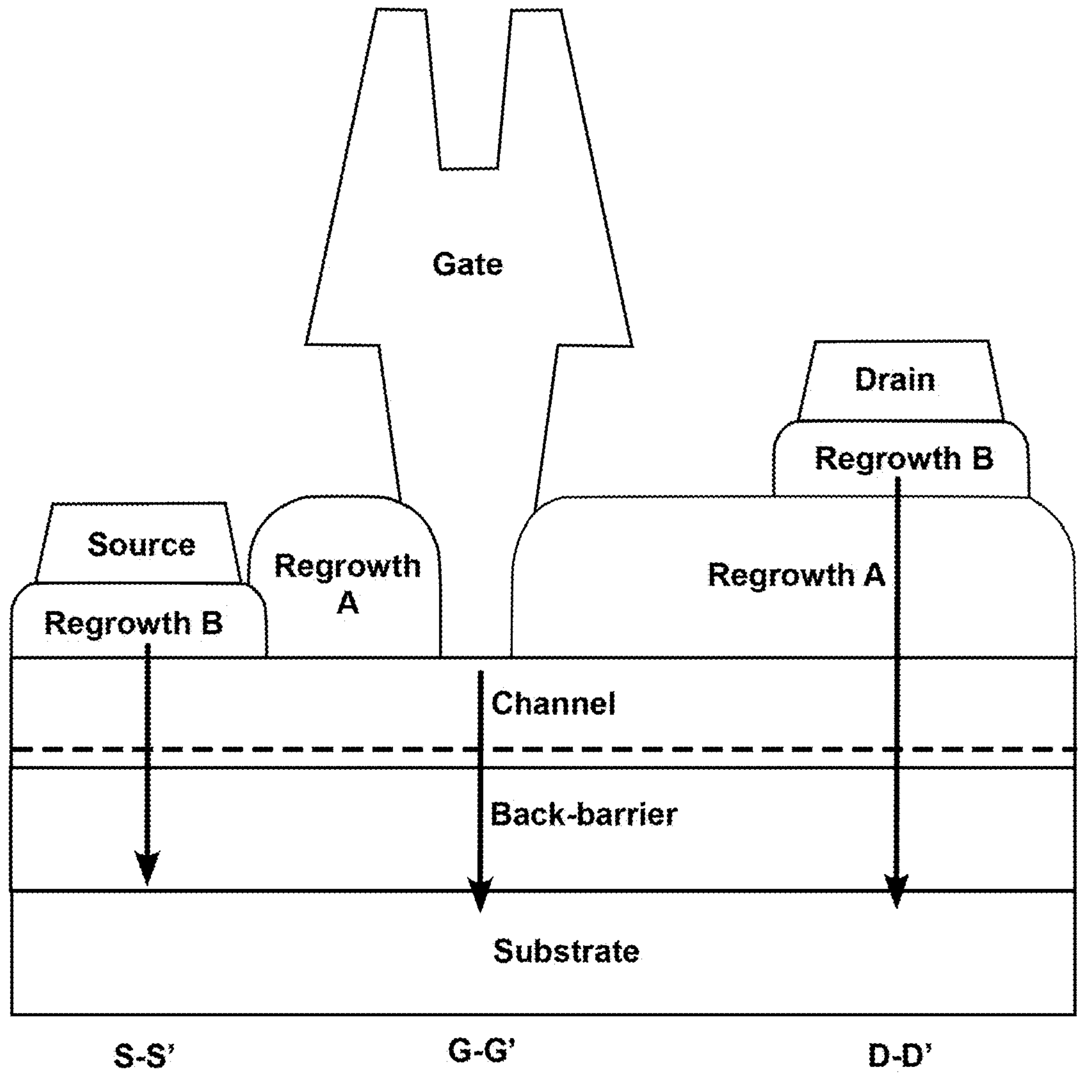
FIG. 22 illustrates the HEMT of FIG. 14 and shows locations of interest used in FIG. 23.
Figure 23C:
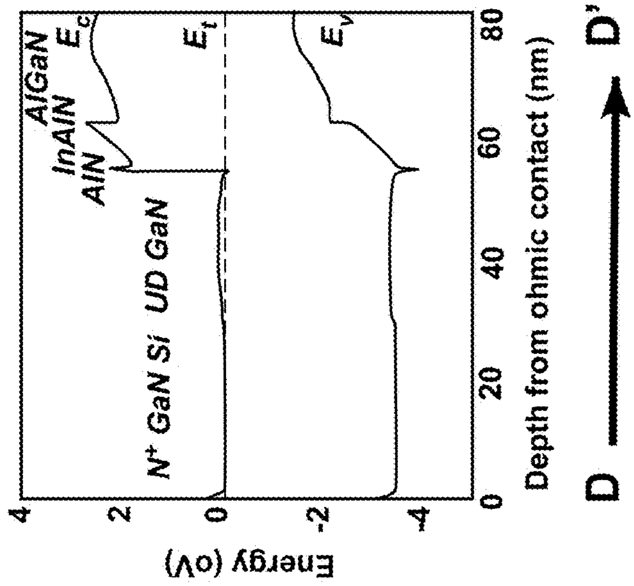
FIGS. 23A to 23C illustrate energy band diagrams at the locations of interest shown in FIG. 22.
Figure 23B:
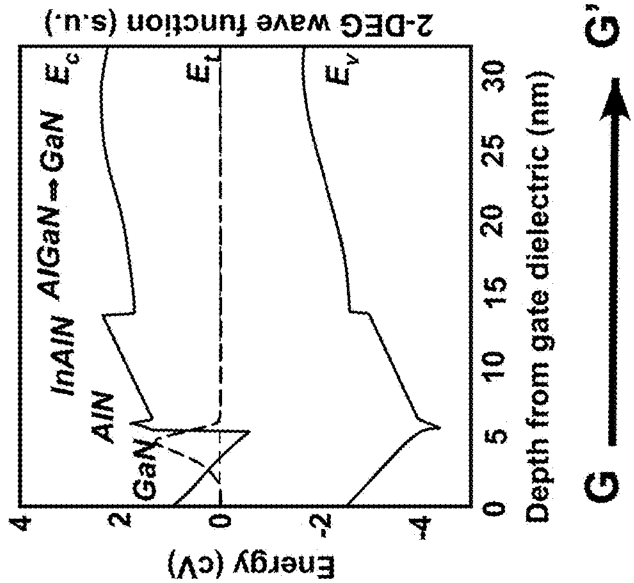
Figure 23A:
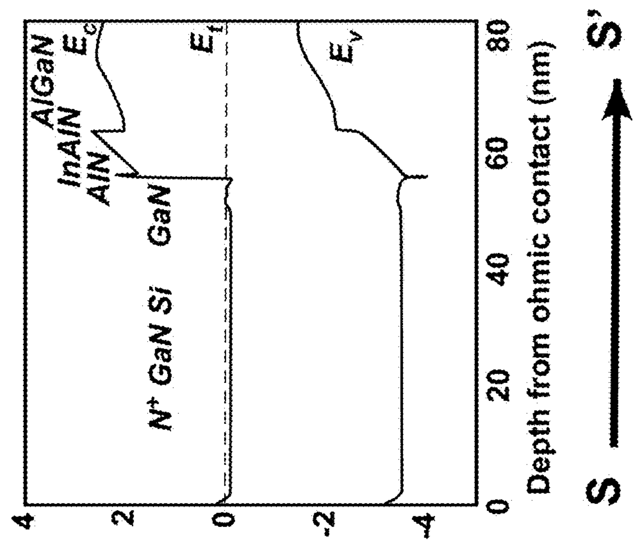

FIG. 22 illustrates HEMT 90 of FIG. 14 and shows locations of interest used in FIGS. 23A, 23B and 23C.

FIG. 23A illustrates energy band diagrams under the source; FIG. 23B illustrates energy band diagrams under the gate and FIG. 23C illustrates energy band diagrams under the drain of HEMT 90, at the locations indicated in FIG. 22. As shown in FIGS. 23A-C, the asymmetric structure of HEMT 90 allows having low losses in the source, while self passivating the high-field drain access region, without compromising device breakdown. The asymmetric structure is achieved by offsetting the gate towards the source, which reduces the gate-source distance and the source access resistance, as a result. The source access resistance is a parasitic element that degrades HEMT performance, specifically the transconductance, the frequency figures of merit, the drain current, the output power, and the device efficiency. Reducing the source access resistance by offsetting the gate to the source improves each figure of merit. Increasing the gate-drain spacing improves the device breakdown voltage, the operating voltage, and the device output power.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

The invention claimed is:

1. A HEMT comprising: a channel layer of a first III-Nitride semiconductor material, grown on a N-polar surface of a back barrier layer of a second III-Nitride semiconductor material; the second III-Nitride semiconductor material having a larger band gap than the first III-Nitride semiconductor material, such that a positively charged polarization interface and two-dimensional electron gas is obtained in the channel layer; a passivation, capping layer, of said first III-Nitride semiconductor material, formed on top of and in contact with a first portion of a N-polar surface of said channel layer; a gate trench traversing the passivation, capping layer, and ending at said N-polar surface of said channel layer; and a gate conductor filling said gate trench; a source contact layer of a fourth III-Nitride semiconductor formed on a second portion of said N-polar surface of said channel layer on a first side of said gate trench; and a drain contact layer of said fourth III-Nitride semiconductor, formed on a portion of a top surface of said passivation, capping layer, on a second side of said gate trench opposite said first side of said gate trench such that any portion of a bottom surface of said drain contact layer is separated from the channel layer by at least said passivation, capping layer.

2. The HEMT of claim 1, comprising a thin layer of a third III-Nitride semiconductor material in said gate trench between said gate conductor and said N-polar surface of said channel layer.

3. The HEMT of claim 1, wherein said passivation, capping layer, is a layer grown on said first portion of said N-polar surface of said channel layer.

4. The HEMT of claim 1, wherein said first III-Nitride semiconductor material is GaN and said second III-Nitride semiconductor material is AlGaN.

5. The HEMT of claim 2, wherein said third III-Nitride semiconductor material is one of AlN, InAlN, AlGaN and InAlGaN.

6. The HEMT of claim 1, wherein said channel layer has a first doping level and said source and drain contact layers have a second doping level larger than the first doping level, wherein: a source access region of said passivation, capping layer, arranged between the source contact layer and the gate trench, has a third doping level comprised between the first and second doping levels; and a drain access region of said passivation, capping layer, arranged between the drain contact layer and the gate trench, has the first doping level.

7. The HEMT of claim 1, wherein said source contact layer and said drain contact layer are layers grown on said second portion of said N-polar surface of said channel layer.

8. The HEMT of claim 1, comprising a source conductor and a drain conductor in contact with respectively said source contact layer and said drain contact layer.

9. The HEMT of claim 1, wherein said fourth III-Nitride semiconductor material is n+ doped GaN or n+ doped InGaN.

10. The HEMT of claim 1, wherein said channel layer has a first doping level and said source and drain contact layers have a second doping level larger than the first doping level, wherein: a source access region of said passivation, capping layer, arranged between the source contact layer and the gate trench, has a third doping level comprised between the first and second doping levels; and a drain access region of said passivation, capping layer, arranged between under the drain contact layer and the gate trench, has the first doping level.

11. The HEMT of claim 1, wherein said source contact layer and said drain contact layer are layers grown respectively on said second portion of said N-polar surface of said channel layer and on said portion of a top surface of said capping layer.

12. The HEMT of claim 1, comprising a source conductor and a drain conductor in contact with respectively said source contact layer and said drain contact layer.

13. The HEMT of claim 1, wherein said fourth III-Nitride semiconductor material is n+ doped GaN or n+ doped InGaN.

14. The HEMT of claim 1, wherein a gate insulator layer lines the side and bottom of said gate conductor in said trench.

* * * * *